(12) United States Patent (10) Patent No.: US 8,168,074 B2
Komvopoulos et al. (45) Date of Patent: May 1, 2012

(54) MODIFICATION OF POLYMER SURFACE WITH SHIELDED PLASMA

(75) Inventors: Kyriakos Komvopoulos, Orinda, CA (US); Satomi Tajima, Beachwood, OH (US)

(73) Assignee: The Regents of the University of California, Oakland, CA (US)

( * ) Notice: Subject to any disclaimer, the term of this patent is extended or adjusted under 35 U.S.C. 154(b) by 808 days.

(21) Appl. No.: 12/233,371

(22) Filed: Sep. 18, 2008

(65) Prior Publication Data

US 2009/0071939 A1 Mar. 19, 2009

Related U.S. Application Data

(63) Continuation-in-part of application No. 11/741,408, filed on Apr. 27, 2007, now Pat. No. 7,879,418.

(60) Provisional application No. 60/973,391, filed on Sep. 18, 2007.

(51) Int. Cl.
*C23F 3/00* (2006.01)
(52) U.S. Cl. .............. 216/81; 216/66; 216/67; 438/725
(58) Field of Classification Search .................. 216/66, 216/67, 81; 438/708, 709, 725; 156/345.39, 156/4
See application file for complete search history.

(56) References Cited

U.S. PATENT DOCUMENTS

| | | | |
|---|---|---|---|
| 4,632,842 A | 12/1986 | Karwoski et al. | |
| 6,074,698 A * | 6/2000 | Sakurai et al. | 427/307 |
| 6,379,741 B1 | 4/2002 | Komvopoulos et al. | |
| 6,458,253 B2 * | 10/2002 | Ando et al. | 204/192.15 |
| 6,482,199 B1 * | 11/2002 | Neev | 606/10 |
| 6,685,743 B2 | 2/2004 | Komvopoulos et al. | |
| 7,411,352 B2 * | 8/2008 | Madocks | 315/111.21 |
| 2002/0094388 A1 * | 7/2002 | Fonash et al. | 427/579 |
| 2003/0132376 A1 * | 7/2003 | Bonnell et al. | 250/252.1 |

OTHER PUBLICATIONS

Beake, B.D. et al.; "Nanoindentation testing of plasma-polymerised hexane films", *Journal of Materials Science*, 2002, pp. 3821-3826, vol. 37.

Clark, D. T. et al.; "An Investigation of the Vacuum UV Spectra of Inductively Coupled RF Plasmas Excited in Inert Gases as a Function of Some of the Operating Parameters", *Journal of Polymer Science: Polymer Chemistry Edition*, 1980, pp. 1233-1246, vol. 18.

Clark, D. T. et al.; "ESCA Applied to Polymers. XV. RF Glow-Discharge Modification of Polymers, Studied by Means of ESCA in Terms of a Direct and Radiative Energy-Transfer Model", Journal of Polymer Science: Polymer Chemistry Edition, 1977, pp. 2321-2345, vol. 15.

(Continued)

*Primary Examiner* — Lan Vinh
(74) *Attorney, Agent, or Firm* — Bozicevic, Field & Francis LLP; Bret E. Field

(57) ABSTRACT

Methods and systems for modifying a surface of a polymer with a shielded plasma are provided. The surface may be modified to create a surface with increased crosslinking and/or a particular mechanical property, such as a coefficient of friction. A shielding arrangement is used to modify the plasma to which the polymer surface is exposed, thereby providing a surface with the desired mechanical properties. In one aspect, a single source that provides multiple species of plasma particles is advantageously used instead of having to switch or move in multiple sources. The extent of crosslinking is evaluated using a surface force microscope to determine a frictional property that is correlated to the crosslinking, e.g., via calibrated values determined from reference surfaces.

26 Claims, 14 Drawing Sheets

OTHER PUBLICATIONS

Clouet, F. et al.; "Interactions of Polymer Model Surfaces with Cold Plasmas: Hexatriacontane as a Model Molecule of High-Density Polyethylene and Octadecyl Octadecanoate as a Model of Polyester. I. Degradation Rate Versus Time and Power", *Journal of Applied Polymer Science*, 1992, pp. 1955-1966, vol. 46.

Dhayal, M. et al.; "Investigating the Plasma Surface Modification of Polystyrene at Low Ion Power Densities", *J. Phys. Chem B*, 2004, pp. 14000-14004, vol. 108. No. 37.

Dong, H. et al.; "State-of-the-art overview: ion beam surface modification of polymers towards improving tribiological properties," *Surface and Coatings Technology*, 1999, pp. 29-40, vol. 111.

Egitto, F. D. et al.; "Modification of Polytetraflouroethylene and Polyethylene Surfaces Downstream from Helium Microwave Plasmas" *Polymer Degradation and Stability*, 1990, pp. 293-308, vol. 30.

Egitto, F.D. et al.; "Plasma modification of polymer surfaces for adhesion improvement," *IBM J. Res. Develop*, 1994, pp. 423-439, vol. 38, No. 4.

Flory, Paul J. et al.; "Statistical Mechanics of Cross-Linked Polymer Networks", *The Journal of Chemical Physics*, 1943, pp. 521-526, vol. 11, No. 11.

Kai, T. et al.; "Role of Vacuum Ultraviolet Irradiation in Plasma-Induced Graft Polymerization in the Pore-Filling Polymerization of Porous Materials", *Journal of Polymer Science: Part A: Polymer Chemistry*, 2005, pp. 2068-2074, vol. 43.

Klapperich, C. et al.; "Nanomechanical properties of energetically treated polyethylene surfaces", *J. Mater. Res.*, 2002, pp. 423-430, vol. 17, No. 2.

Knop, H. et al.; "A temperature-stabilized LiF line filter for the argon 106.7 nm resonance line", *Meas. Sci. Technol.*, 1997, pp. 1275-1278, vol. 8.

Kuzuya, M. et al.; "Nature of Plasma-Induced Surface Radicals of Powdered Polyethylene Studied by Electron Spin Resonance", *Macromolecules*, 1993, pp. 1990-1995, vol. 26, No. 8.

Momose, Y. et al.; "Chemical reactivity between Teflon surfaces subjected to argon plasma treatment and atmospheric oxygen", *J. Vac. Sci. Technol. A*, 1992, pp. 229-238, vol. 10, No. 1.

Partridge, R. H.; "Near-Ultraviolet Absorption Spectrum of Polyethylene", *The Journal of Chemical Physics*, 1966, pp. 1697-1684, vol. 45, No. 5.

Partridge, R. H.; "Vacuum-Ultraviolet Absorption Spectrum of Polyethylene", *The Journal of Chemical Physics*, 1966, pp. 1685-1690, vol. 45, No. 5.

Schonhorn, H. et al.; "Surface Treatment of Polymers for Adhesive Bonding", *Journal of Applied Polymer Science*, 1967, pp. 1461-1474, vol. 11.

Shim, C. H. et al.; "Effect of a shield on the formation of the superconducting phases in the Bi-Sr-Ca-Cu-O film deposited by *off-axis* sputtering", *Physica C*, 1996, pp. 356-364, vol. 271.

Tajima, S. et al.; "Dependence of nanomechanical modification of polymers on plasma-induced cross-linking", *Journal of Applied Physics*, 2007, pp. 014307-1 to 014307-8, vol. 101.

Tajima, S. et al.; "Effect of ion energy fluence on the topography and wettability of low-density polyethylene exposed to inductively coupled argon plasma", *J. Phys.D: Appl. Phys.*, 2006, pp. 1084-1094, vol. 39.

Tajima, S. et al.; "Effect of reactive species on surface crosslinking of plasma-treated polymers investigated by surface force microscopy", *Applied Physics Letters*, 2006, pp. 124102-1 to 124102-3, vol. 89.

Tajima, S. et al.; "Surface Modification of Low-Density Polyethylene by Inductively Coupled Argon Plasma", *J. Phys. Chem. B.*, 2005, pp. 17623-17629, vol. 109.

Wertheimer, M.R. et al.; "Industrial processing of polymers by low-pressure plasmas: the role of VUV radiation", *Nucl. Instr. and Meth. in Phys. Res. B.*, 1999, pp. 65-75, vol. 151.

* cited by examiner

| Treatment | Top shield | Side shield | Plasma species[a] | Cutoff wavelength[b] $\lambda_c$ (nm) | Frictional energy $E_f$ (nJ) | |
|---|---|---|---|---|---|---|
| | | | | | $L=100~\mu N$ $\bar{h}=160$ nm | $L=750~\mu N$ $\bar{h}=850$ nm |
| None | — | — | — | — | 0.33±0.07 | 2.92±0.50 |
| Ar plasma | — | — | I, P, VUV, UV | — | 2.00±0.31 | 8.63±1.10 |
| | LiF | — | P, VUV, UV | 104.6[c] | 1.71±0.47 | 9.97±0.75 |
| | CaF$_2$ | — | P, VUV, UV | 122.3[c] | 1.67±0.37 | 9.31±0.97 |
| | Al$_2$O$_3$ | — | P, VUV, UV | 143.0[c] | 1.16±0.10 | 6.81±0.76 |
| | SiO$_2$ | — | P, VUV, UV | 164.4[c] | 1.23±0.25 | 5.97±0.69 |
| | Al | — | P | — | 1.10±0.16 | 5.84±0.72 |
| | LiF | EPDM | VUV, UV | 104.6[c] | 0.59±0.08 | 3.94±0.31 |
| | Pyrex® | Pyrex® | UV | 293.2 | 0.49±0.11 | 3.39±0.67 |

[a]$I$=ions, $P$=uncharged particles, VUV=vacuum ultraviolet photons, UV=ultraviolet photons.
[b]20% transmittance.

FIG. 2

(A)
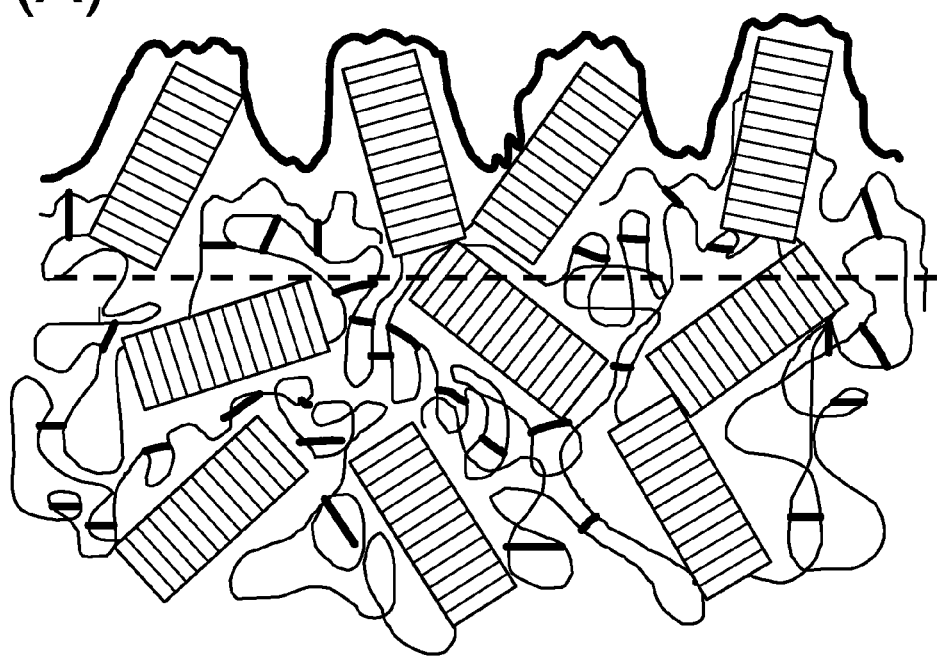
(B)
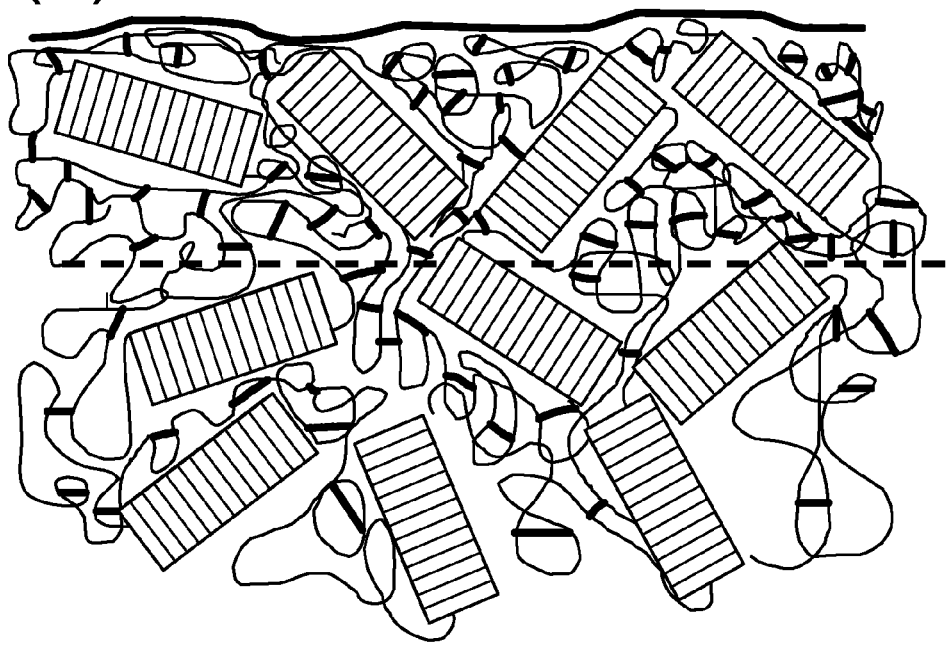
FIG. 12

MODIFICATION OF POLYMER SURFACE WITH SHIELDED PLASMA

CROSS-REFERENCES TO RELATED APPLICATIONS

The present application claims priority from and is a non provisional application of U.S. Provisional Application No. 60/973,391, entitled "METHOD FOR VARYING THE DEGREE OF CROSSLINKING AT POLYMER SURFACES BY DIFFERENT ACTIVE PLASMA SPECIES" filed Sep. 18, 2007, the entire contents of which are herein incorporated by reference for all purposes.

The present application also claims priority from and is a continuation-in-part of U.S. application Ser. No. 11/741,408, entitled "METHOD FOR DEPOSITING FLUOROCARBON FILMS ON POLYMER SURFACES" filed Apr. 27, 2007, the entire contents of which are herein incorporated by reference for all purposes.

STATEMENT AS TO RIGHTS TO INVENTIONS MADE UNDER FEDERALLY SPONSORED RESEARCH OR DEVELOPMENT

This invention was made with Government support under Grant (Contract) Nos. CMS-0528506 and CMS-0127754 awarded by the National Science Foundation. The Government has certain rights to this invention.

FIELD OF THE INVENTION

The present invention relates generally to the preparation and measurement of surfaces of polymeric substrates, and more particularly to modifying the polymer surfaces with a shielded plasma (e.g., a plasma with some of its species eliminated by a shield) and measuring a friction parameter of the modified polymer surface.

BACKGROUND

Polymeric substrates are used in many modern day products, such as manufacturing, biomedical products, or even consumer products. Each application may require different properties of the polymeric substrate. For example, one product may benefit from a polymeric substrate that is very wear-resistant, while another product may benefit from a polymeric substrate that glides or slides along another object. Accordingly, it would be beneficial to have methods to provide polymeric substrates with the ideal properties for a particular application.

One way that a polymer surface can be modified is by polymer surface crosslinking. Polymeric substrates are modified to increase the extent of cross-linking between the polymer chains in the near-surface region of the polymer. Surface crosslinking (polymerization) may be done, for example, to increase the wear resistance of polymer surfaces used in various industrial and biomedical applications. Pristine polymer surfaces generally possess a weak surface layer consisting of uncrosslinked chains, which is detrimental to polymer wear resistance against other surfaces (Hansen, R. H. and Schonhorn, H., Polym. Lett., 4:203 (1966); Egitto, F. D. and Matienzo, L. J., IBM J. Res. Develop., 38:423 (1994)). The replacement of this weak layer by a crosslinked layer is beneficial to the cohesive strength of adhesive joints (Hansen, R. H. and Schonhorn, H., Polym. Lett., 4:203 (1966)). The crosslinked layer can also provide a diffusion barrier against solvents and moisture that affect negatively the interfacial adhesion strength (Egitto, F. D. and Matienzo, L. J., IBM J. Res. Develop., 38:423 (1994)), which is critical to maintaining a strong bonding of polymers to other surfaces.

Direct energy transfer from energetic particles (i.e., ions and uncharged particles) and/or radiation (i.e., vacuum ultraviolet (VUV) and ultraviolet (UV) light, γ-ray, and X-ray) to the polymer surface induces surface crosslinking (Dong, H. and Bell, T., Surf. Coat. Technol., 111:29 (1999). Conventional γ-ray and X-ray treatments are bulk treatments that tend to degrade the mechanical properties of polymers, such as fracture toughness (Baker, D. A. et al., Polymer, 41:795 (2000)). Therefore, surface-specific methods resulting in polymer surface crosslinking while preserving the bulk properties are more effective than bulk treatments.

One surface-specific method is polymer surface crosslinking by an inert gas plasma (Hansen, R. H. and Schonhorn, H., Polym. Lett., 4:203 (1966)). The effect of plasma parameters (such as power of plasma source, distance of source from the polymer surface, pressure, flow rate of gas used to generate plasma) on the crosslinked layer thickness has been studied (Flory, P. J. and Rehner, J. Jr., J. Chem. Phys., 11:521 (1943)). For plasma-treated polyethylene, the thickness of the crosslinked layer is typically between 0.3 and 1.6 μm, depending on the plasma gas, power, and treatment time (Yao, Y. et al., J. Adhes. Sci. Technol., 7:63 (1993)). The general trend is for the crosslinked layer thickness to increase with the plasma power and the processing time.

Similarly, for ion implantation techniques, the ion dose is altered in order to vary the depth of implantation (and thus crosslinking). Shields have been used to protect the surfaces from any modification or to control the depth of implantation.

However, the increase in the thickness of the cross-linked layer beyond a certain value has a limited effect on the actual properties of the surface itself. Accordingly, new methods and systems are needed to provide polymeric surfaces with specific mechanical properties.

Additionally, to determine whether a product has the required mechanical properties, the properties need to be evaluated. The chemical bonding of crosslinked layers has been studied by electron spin resonance spectroscopy and X-ray photoelectron spectroscopy, and the crosslinked layer thickness has been measured by the swelling and rheological techniques. Although these methods are effective in identifying crosslinking and radicals on plasma-treated polymer surfaces, they do not provide information for the mechanical modification. Surface chemical changes and the presence of radicals cannot be directly correlated to the strength of the crosslinked surface. In fact, radicals may result in chain scission, which is detrimental to the mechanical strength of the polymer surface. (Momose, Y. et al., J. Vac. Sci. Technol. A 10:229 (1992))

Embodiments of the invention address the above problems of surface modification and measurement, and other problems, individually and collectively.

BRIEF SUMMARY

Embodiments are directed to methods and systems for modifying a surface of a polymer with a shielded plasma, e.g., to create a surface with a particular mechanical property, such as a coefficient of friction. A shielding arrangement is used to modify the plasma to which the polymer surface is exposed, thereby providing a surface with the desired mechanical properties. In one embodiment, a single source that provides multiple species of plasma particles (e.g., any two or more selected from ions, photons, and uncharged particles) is advantageously used instead of having to switch or move in multiple sources.

Embodiments are also directed to method and systems for measuring the mechanical properties of the modified surface. Results presented herein show the efficacy of such methods.

According to one exemplary embodiment, a method of modifying a coefficient of friction of a surface of a polymeric substrate is provided. A plasma stream is generated by a plasma source. The plasma stream includes a plurality of species of particles. The plurality of species includes ions and photons. The plasma stream is modified with a shield arrangement that includes a top shield spaced apart from the polymeric substrate. The polymer surface is then exposed to the modified plasma stream that has a reduced amount of ions. In one embodiment, all of the ions and/or radiation (e.g. with an Al shield) are eliminated from the modified plasma stream. The reduction of exposure of the polymer surface to certain plasma particles, potentially of varying energy levels (e.g., ultraviolet versus vacuum ultraviolet radiation), is achieved by the shield arrangement.

According to another exemplary embodiment, a system for modifying a coefficient of friction of a surface of a polymeric substrate is provided. A plasma source generates a plasma stream. The plasma stream includes a plurality of species of particles, and the plurality of species includes ions and photons. A shield arrangement lies in between the plasma source and the polymer surface and is configured to modify the plasma stream. The shield arrangement includes a top shield spaced apart from the polymeric substrate, and reduces an exposure of the polymer surface to at least the ions.

According to another exemplary embodiment, a method of evaluating an extent of crosslinking in a surface of a polymeric substrate is provided. A load is applied to a tip. The tip is moved across the surface of the polymeric substrate. A frictional property of the surface is measured from a friction force imparted on the tip from the surface during movement of the tip. Based on frictional property, an extent of crosslinking in the polymer surface is determined.

A better understanding of the nature and advantages of the present invention may be gained with reference to the following detailed description and the accompanying drawings.

BRIEF DESCRIPTION OF THE DRAWINGS

FIG. 2 is a table showing the type of shielding, plasma species, cutoff wavelength, and frictional energy dissipated due to nanoscratching of untreated and plasma-treated LDPE according to embodiments of the present invention.

FIG. 12 shows surface molecular models of LDPE exposed to relatively (A) intense ($W=6.3\times10^5$ $J/m^2$) and (B) mild ($W=0.7\times10^5$ $J/m^2$) plasma conditions according to an embodiment of the present invention.

DETAILED DESCRIPTION OF EXEMPLARY EMBODIMENTS

Figure 1:
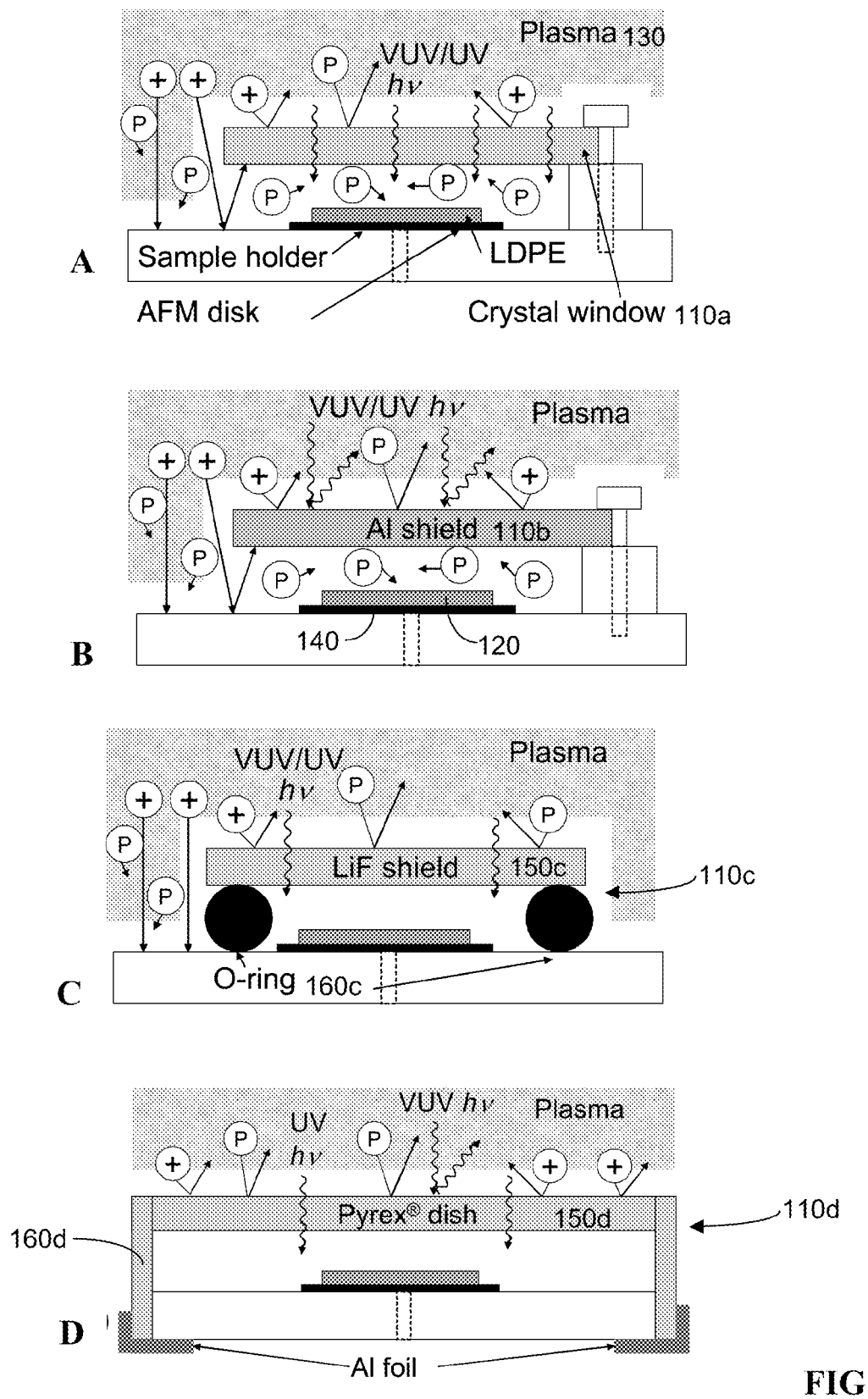
FIGS. 1A-1D show sample shielding from various plasma species: (A) crystal top shield, (B) Al top shield, (C) LiF top shield and O-ring side shield, and (D) Pyrex® top and side shield according to embodiments of the present invention.

Embodiments are directed to modifying a surface of a polymer with a shielded plasma. A shielding arrangement influences the modification by modifying the plasma stream (which may include ions, photons, and uncharged particles) to which the surface is exposed. In one aspect, the modifications alter a particular mechanical property, such as a shear strength and coefficient of friction of the surface. To confirm the proper modification, embodiments are directed to measuring the mechanical property, e.g., by dragging a loaded probe across the surface. The concept of crosslinking is first introduced, and then the surface modification and measurements are discussed.

I. Crosslinking

Energetic particles in the plasma (also called a plasma stream), such as ions, uncharged particles (i.e., neutrals, metastables, and radicals), and vacuum ultraviolet (VUV) and ultraviolet (UV) photons have sufficient energy to produce radicals by breaking the C—H bonds. The recombination of these radicals leads to crosslinking of the molecular chains at the polymer surface. Surface crosslinking can involve three main process steps, namely, obstruction of hydrogen atoms from molecular chains by energetic species, such as ions, uncharged particles, and VUV/UV photons, formation of radicals at hydrogen obstruction sites, and reaction between produced radicals leading to the formation of a crosslinked surface layer.

The origins of chain crosslinking depend on the radiation wavelength $\lambda$. For instance, crosslinking of a polymer surface may result from radicals produced directly from the molecular chains ($\lambda < 178$ nm) or indirectly from impurities (e.g., aromatic groups, C=C bonds, carbonyls, and aliphatic olefins) that can generate radicals by absorbing light ($\lambda > 178$ nm). The reaction of these impurity radicals with the molecular chains produces chain radicals that result in crosslinking. Hereafter, crosslinking due to radicals produced directly and indirectly from the molecular chains will be referred to as chain-induced and impurity-induced crosslinking.

Mechanical property modification of surface-crosslinked polymers is important for many manufacturing and performance aspects of products. Thus, controlled modification is desirable. Also, accurate evaluation of surface mechanical properties of crosslinked polymers requires techniques with nanometer depth resolution. Therefore, surface force microscopy and its derivative techniques are used for nanomechanical testing of surface-crosslinked polymers. For example, the mechanical properties (e.g. shear resistance of the crosslinked surface layer) of polymer surfaces modified by ion beam and plasma techniques can be evaluated by nanoscratching (Tajima, S, and Komvopoulos, K., Appl. Phys. Lett., 89, 124102 (2006) and J. of Appl. Phys. 101: 014307 (2007), both of which are written by the present inventors and are incorporated by reference.)

II. Surface Modification with Shielded Plasma

A. Samples

In the example presented below, pellets of low-density polyethylene (LDPE) (Sigma-Aldrich, St. Louis, Mo.) were placed on atomic force microscope (AFM) metal disks, heated at 160° C. for 2 min to become transparent, and subsequently pressed against a clean glass plate. Subsequently, the samples were heated again at 160° C. for 3 min to obtain a flat surface, cooled in ambient air for ~1 min, and finally peeled off from the glass plate. The sample thickness was in the range of 800-900 μm. X-ray diffraction and differential scanning calorimetry studies demonstrated that the crystallinity of the LDPE samples was equal to ~50%. These values are provided as exemplary operational parameters. Other varying parameters may be used as is known to one skilled in the art.

B. Plasma-Assisted Surface Modification

In this example, the samples were mounted on a grounded Al holder of 5 cm diameter and 2 cm thickness and were exposed to inductively coupled high-density Ar plasma generated by a radio frequency plasma source (Litmas Inc., Charlotte, N.C.). The base pressure in the main chamber was set at ~$10^{-6}$ Torr. High-purity (99.999%) Ar gas (Praxair, Danbury, Conn.) was introduced in the chamber 5 min before the onset of plasma treatment to stabilize the flow rate at 100 sccm. The pressure during the treatment was maintained at 500 mTorr by a capacitance manometer and a pendulum valve. The plasma power and the treatment time were set equal to 1200 W and 15 min, respectively. In all treatments, the sample distance from the plasma power source was fixed at 45 cm. The Ar flow rate of 100 sccm was maintained for 5 min after each treatment to allow active plasma species to gradually reach equilibrium. Examination of the treated samples confirmed that surface melting did not occur during plasma treatment. More details about the experimental setup, measurement of the ion energy fluence, and effect of ion energy fluence on the roughness, wetability, and chemical state of the plasma-treated LDPE surfaces can be found elsewhere (Tajima, S, and Komvopoulos, K., J. Phys. D: Appl. Phys., 39:1084 (2006) and J. Phys. Chem. B, 109:17623 (2005)).

As previously mentioned, basic operational parameters do have an influence on the modification of the surface. However, such basic parameters do not provide a means change or control mechanical properties of the surface. Therefore, embodiments use a shielding arrangement to provide only certain types of plasma species (e.g. just photons), potentially with certain ranges of energies, to the polymer surface to thereby control the modification and the resulting mechanical properties.

C. Shielded Plasma Modification

FIGS. 1A-1D show sample shielding from various plasma species: (A) crystal top shield, (B) Al top shield, (C) LiF top shield and O-ring side shield, and (D) Pyrex® top and side shield according to embodiments of the present invention. The shields can be used with any type of plasma process, e.g., both inductively or capacitively coupled plasma processes. The shields are advantageous when the plasma source provides a plasma stream that includes ions and photons, and also when it includes uncharged particles.

The shield arrangement 110 (labeled 110a-d) may be used to shield the polymeric substrate 120 from the plasma to control the plasma process and to selectively modify the surface (either physically and/or chemically) of the polymeric substrate. An advantage of using a shielded plasma over pulsed or downstream plasma is that the treatment conditions can be varied without changing the power supply or chamber configuration. In some embodiments, the shield may comprise inorganic materials such as Al, Pyrex®, LiF, $CaF_2$, $Al_2O_3$, and $SiO_2$.

By using a shield, one can control the types of plasma species and/or radiation energy reaching the polymeric substrate. For example, Al and other ion and photon blocking metals may only allow uncharged particles to reach the polymer substrate. On the other hand, LiF, $CaF_2$, $Al_2O_3$, and $SiO_2$ may allow only uncharged particles, UV (ultraviolet) and/or VUV (vacuum ultraviolet) radiations to reach the polymer substrate. Herein, the shield is also called a window when it allows some particles to pass through.

The shield 110 may be stationary within the chamber, or is preferably movable (e.g., coupled to a movable motor) in the chamber so that it can cover or not cover some or all of the polymeric substrate during the surface modification process step. Additionally, the shield can cover the substrate during one process, but not a subsequent process, or vice-versa.

FIG. 1A shows a shield arrangement 110a including a crystal top shield. In one embodiment, a holder is connected to the shield 110a to move the crystal shield. The shield 110a covers a sample 120 on a sample holder 140 and it helps to prevent ionized particles from reaching the sample 120, but not photons. Neutral particles can reach the sample 120 through a space that is between the sample holder 140 (and table underneath as shown) and the shield 110 (e.g., by a side passage via diffusion).

FIG. 1B shows a shield arrangement 110b including an aluminum top shield. The shield 110b helps to prevent ionized particles and VUV/UV radiation from reaching the sample 120, but allows uncharged particles to reach the substrate by diffusing from the open side.

FIG. 1C shows a shield arrangement 110c including a LiF top shield 150c, and a holder in the form of an O-ring acting as a side shield 160c. The shield 110c helps to prevent ionized and neutral particles from reaching the sample 120. However, certain UV/VUV radiation can still reach the sample 120.

FIG. 1D shows a shield arrangement 110d including a Pyrex® top shield 150d and Pyrex® side shields 160d, and may include a holder as can the other shield arrangements. The shield 110d completely covers the sample 120 on a sample holder 140 and it helps to prevent ionized and neutral particles, as well as VUV radiation from reaching the sample 120. Only UV radiation can reach the sample 120.

As illustrated in FIGS. 1A-1D, by using a shield, the mechanical properties of the sample 120 can be selectively altered without modifying processing conditions such as power, gas flow rate, etc. during a plasma process.

D. Measurements

Microprobe-based techniques of nanometer depth resolution and deconvolution of the effects of the various plasma species on surface modification can be used to study surface crosslinking of plasma-treated polymers. In one exemplary embodiment, the nanomechanical properties were measured with a surface force microscope consisting of an AFM (Nanoscope II, Digital Instruments, Santa Barbara, Calif.) and a two-dimensional force transducer (Triboscope, Hysitron, Inc., Minneapolis, Minn.). Normal and tangential (friction) forces were generated from independent capacitor plates. All the experiments were performed within 3 h after the treatment with a conospherical diamond tip of 20 μm nominal radius of curvature and 90° apex angle. Before each test, the tip was cleaned with isopropanol to remove any contaminants and/or polymer debris transferred from the previous test.

The normal load L was varied in the range of 50-750 μN, while the loading and unloading rates were fixed at 50 μN/s. The tip was displaced laterally by a distance of 16 μm under constant normal load and sliding speed equal to 0.27 μm/s. The frictional energy $E_f$ (calculated by numerical integration of the area under the curve of the friction force F) was obtained as a function of the average nanoscratch depth $\bar{h}$. To consider the experimental scatter, the frictional energy and the coefficient of friction were obtained as averages of six experiments performed with two or three samples exposed to identical treatment conditions.

Further discussion of the measurement process is provided later. Results using different shield arrangements including optical windows of different cutoff wavelengths and metal shields to control the plasma species for the nanomechanical modification of the LDPE surfaces are now provided.

E. Results

FIG. 2 is a table showing the type of shielding, plasma species, cutoff wavelength, and frictional energy dissipated due to nanoscratching of untreated and plasma-treated LDPE according to embodiments of the present invention.

To control the transmittance of the Ar emission lines in the VUV region, optical windows of 25 mm diameter and 2 mm thickness consisting of LiF, $CaF_2$, $Al_2O_3$, and $SiO_2$ (UV-grade fused silica) crystals (International Scientific Products Co., Irvington, N.Y.) were fixed at a distance of 2 mm above the polymer surface by a set screw attached to the sample holder. Because the 0% transmittance could not be determined for all crystals, the cutoff wavelength $\lambda_c$ corresponding to 20% transmittance of each shield material is given in FIG. 2. For a description of cutoff wavelength see (Laufer, A. H. et al., Opt. Soc. Am. 55, 64 (1965).)

With the configuration of FIG. 1A, only photons with $\lambda > \lambda_c$ and uncharged particles entering from the open sides interacted with the polymer surface. Since $\lambda_c < 178$ nm for all VUV crystals, chain-induced crosslinking occurred in the plasma treatments involving these crystal shields. Hence, the effect of the VUV wavelength range on chain-induced surface crosslinking was evaluated by comparing the results for LiF, $CaF_2$, $Al_2O_3$, and $SiO_2$ top shield.

With the configuration of FIG. 1B, an aluminum plate (25 mm×25 mm×1 mm) was similarly fixed at a distance of 2 mm above the sample surface. This configuration allowed only the nondirectional uncharged particles to reach the sample surface from the open sides.

With the configuration of FIGS. 1C and 1D, the effects of VUV and UV radiation were examined. Two optical windows with sealed sides were used to block the ions and the uncharged particles. For FIG. 1C, an optical window consisting of LiF was placed on top of an ethylene propylene (EPDM) rubber O-ring that provided side shielding. Thus, surface modification in this treatment resulted only from VUV (wavelengths>104 nm) and UV radiation.

For FIG. 1D, the window was a 1-mm-thick Pyrex® glass dish of 6 cm diameter and 1 cm height that covered the entire sample holder. To block the uncharged particles, the bottom opening of the glass dish and the sample holder were covered with Al foil. A 1.5-mm-diameter hole was drilled under the AFM disk to maintain the same pressure inside and outside the sample cover. The LiF crystal can transmit both VUV and UV photons, while the Pyrex® shield can only transmit UV photons. The cutoff wavelength of the Pyrex® dish, measured with a Cary 4000 UV-visible spectrophotometer (Varian, Inc., Palo Alto, Calif.), is given in FIG. 2. Differences between chain-induced and impurity-induced crosslinking were evaluated by comparing the shear resistance of LDPE for LiF ($\lambda_c < 178$ nm) top shield and EPDM side shield with that of LDPE with Pyrex® ($\lambda_c > 178$ nm) top/side shield.

F. Analysis

The role of different plasma species in surface crosslinking has been elucidated by comparing friction results from nanoscratching experiments that reveal differences in the shear strength of plasma-treated and VUV/UV-treated LDPE surfaces. An objective of this investigation was to control the exposure of the polymer surface to the plasma species and evaluate the resulting surface modification in terms of the frictional energy dissipated by nanoscratching.

Surface crosslinking may enhance the polymer shear resistance through the formation of three-dimensional networks of crosslinked molecular chains. Such changes in the surface nanomechanical properties can be probed by nanoscratching because of the inherent high surface specificity of this technique. This is demonstrated by the coefficient of friction results shown in FIG. 3.

Figure 3:
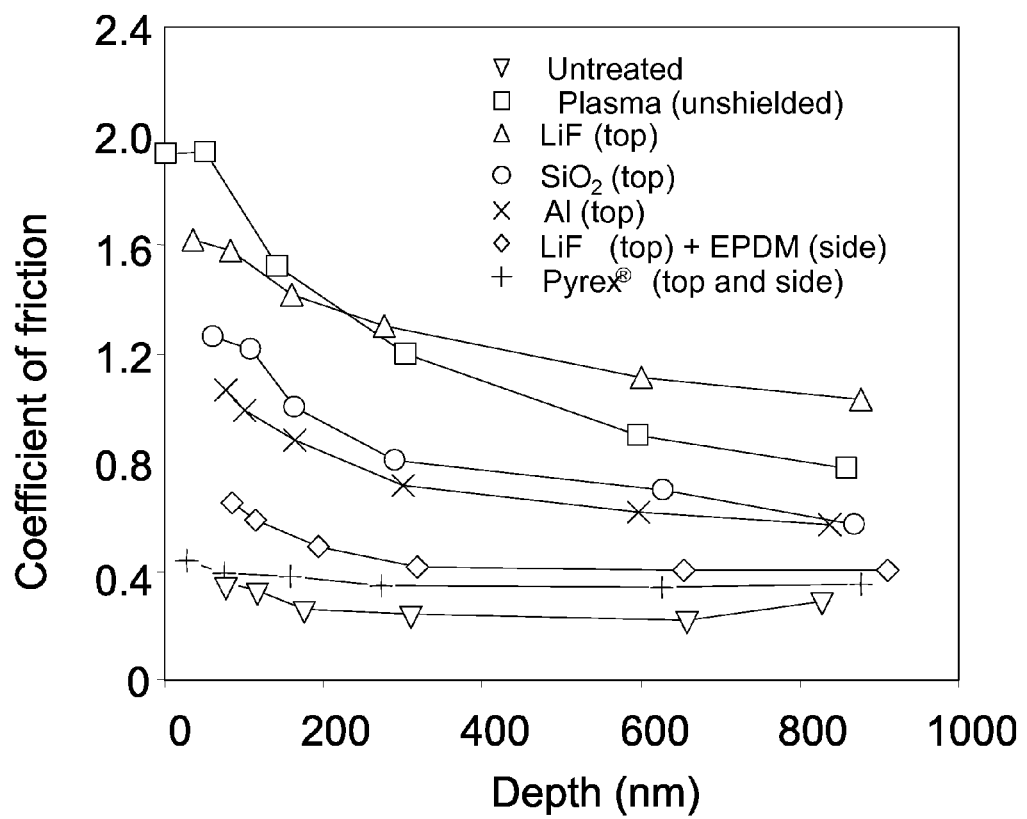
FIG. 3 is a plot showing the coefficient of friction versus nanoscratch depth for untreated (∇) and plasma-treated LDPE without a shield (□) and with LiF (Δ), $SiO_2$ (○), and Al (x) top shield, LiF top shield and EPDM side shield (◇), and Pyrex® top/side shield (+) according to embodiments of the present invention.

FIG. 3 is a plot showing the coefficient of friction versus nanoscratch depth for untreated (∇) and plasma-treated LDPE without a shield (□) and with LiF (Δ), $SiO_2$ (○), and Al(x) top shield, LiF top shield and EPDM side shield (◊), and Pyrex® top/side shield (+) according to embodiments of the present invention.

The steep friction coefficient gradients at the polymer surface indicate a decrease in crosslink density with increasing depth. The progressive decrease in the friction coefficient slope in the order of LiF, $SiO_2$, and Al top shield, LiF top shield and EPDM side shield, and Pyrex® top/side shield is attributed to the effects of different plasma species on surface crosslinking. The higher friction coefficient of the unshielded LDPE compared to that of the LiF-shielded LDPE for shallow depths ($\bar{h} < 160$ nm) is attributed to VUV radiation of $\lambda < 104$ nm and the direct energy transfer from the impinging $Ar^+$ ions, in agreement with the predicted confinement of ions and short-wavelength VUV radiation within a shallow depth. (Clark, D. T. and Dilks, A., J. Polym. Sci., Polym. Chem. Ed. 15:2321 (1977); Kai, T., et al. J. Polym. Sci., Part A: Polym. Chem. 43:2068 (2005).)

As described above, FIG. 2 shows the frictional energy $E_f$ dissipated by the untreated and treated LDPE samples due to nanoscratching for $\bar{h}=160$ and 850 nm. The top shields prevented $Ar^+$ ion bombardment on the LDPE surface and reduced the VUV and UV photon energy (depending on $\lambda_c$), while the side shields inhibited the uncharged particles from interacting with the polymer surface. The significantly higher $E_f$ value of the plasma-treated LDPE is attributed to the enhancement of the surface shear resistance by crosslinking. The increase of $E_f$ with $\bar{h}$ is due to the greater amount of energy dissipated at larger plowing depths.

The contributions of $Ar^+$ ions and VUV photons of resonance lines $\lambda<104$ nm (ArI and ArII lines) (Clark, D. T. and Dilks, A., J. Polym. Sci., Polym. Chem. Ed. 18:1233 (1980)) to chain-induced crosslinking can be interpreted by contrasting the $E_f$ values of the unshielded and the LiF-shielded LDPE samples. The effects of different VUV ranges on chain-induced crosslinking can be quantified by comparing the $E_f$ values for LiF, $CaF_2$, $Al_2O_3$, and $SiO_2$ top shield. The main difference in the treatments with LiF and $CaF_2$ top shield is the transmittance of the ArI lines at $\lambda=104.8$ and 106.7 nm (Knop, H., et al., Meas. Sci. Technol. 8:1275 (1997)), attributed to transition $3p^54s \rightarrow 3p^6$. Since the $E_f$ values for LiF and $CaF_2$ top shield are within the experimental scatter, it may be concluded that the effect of the ArI emission lines on chain-induced crosslinking was secondary. The plasma treatments with $CaF_2$ and $Al_2O_3$ top shield differ by the Ar emission line at $\lambda=137.7$ nm. (Egitto, F. D. and Matienzo, L. J., Polym. Degrad. Stab. 30:293 (1990)). The marked decrease in $E_f$ reveals a significant effect of this Ar emission line on crosslinking. The treatments with $Al_2O_3$ and $SiO_2$ top shield provide insight into the importance of the Ar emission line at $\lambda=160$ nm in crosslinking. The fact that the corresponding $E_f$ values do not differ statistically indicates that this line did not contribute directly to crosslinking. In the wavelength range of 110-160 nm, attenuation of the VUV energy to 1/10 of its initial value occurs at a distance of ~100 nm below the LDPE surface. (Kai, T. et al. J. Polym. Sci., Part A: Polym. Chem. 43:2068 (2005).) However, FIG. 2 shows a significant effect of the Ar emission line at $\lambda=137.7$ nm on the magnitude of $E_f$. This implies that surface modification was affected predominantly by the radiation wavelength range, while the depth-dependence of the absorbance produced a secondary effect.

The significantly different $E_f$ values of untreated and plasma-treated (with Al top shield) LDPE suggest that uncharged particles played an important role in surface crosslinking. However, the much lower $E_f$ value for Al top shield indicates that the degree of crosslinking was less than that of the unshielded LDPE. The significantly lower $E_f$ values obtained with side shielding reveal surfaces of low shear resistance. This suggests that VUV and UV radiation alone did not produce a highly crosslinked surface layer, in contrast to previous results that showed similar crosslinked layers for plasma and VUV treatment. (Hudis, M. and Prescott, L. E., Polym. Lett. 10:179 (1972)). The low value of $E_f$ for Pyrex® top/side shield implies that impurity-induced crosslinking was inferior to chain-induced crosslinking. This may be attributed to differences in crosslink concentration. In the case of chain-induced crosslinking, all crosslink sites are within the modified surface layer of predicted thickness of a few tens of nanometers (FIG. 3), whereas in the case of impurity-induced crosslinking, the crosslink sites are distributed in a much larger volume.

Given the relative contributions of reactive plasma species on the mechanical modification of crosslinked polymer surfaces, a desired mechanical property may be selected by using an appropriate shield. In one aspect, the surface modification is primarily due to the simultaneous effects of uncharged particles and VUV photons and secondarily due to energetic $Ar^+$ ions and VUV radiation of $\lambda<104$ nm, which modified only the outermost surface layer. In particular, VUV emission at $\lambda=137.7$ nm plays a key role in chain-induced crosslinking; however, the VUV effect becomes less prominent for $\lambda>137.7$ nm. Impurity-induced crosslinking played a secondary role in the surface modification process due to the lower surface concentration of crosslink sites produced from impurity originating radicals.

G. Method

Figure 4:
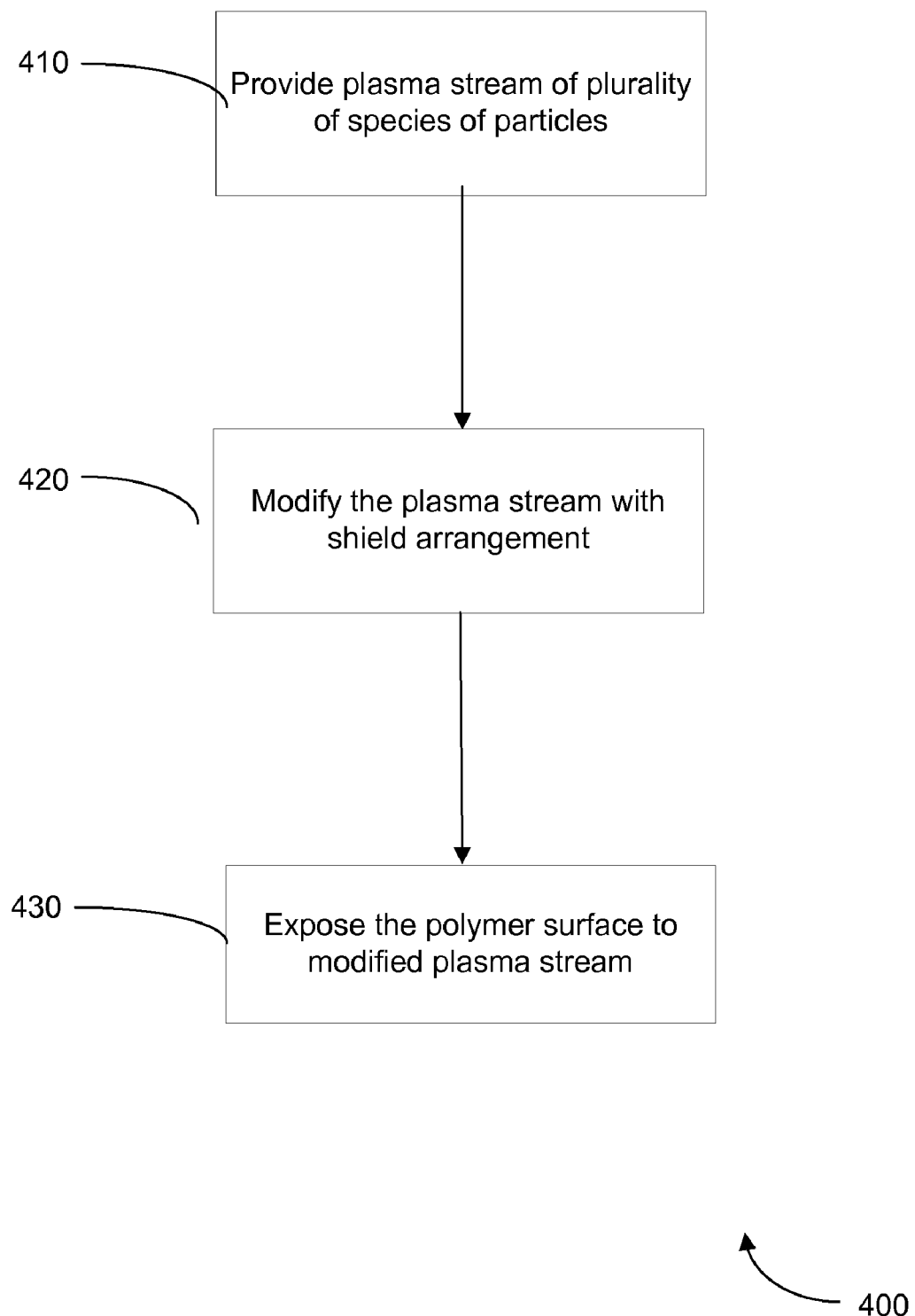
FIG. 4 is a flowchart illustrating a method for modifying a coefficient of friction of a surface of a polymeric substrate according to an embodiment of the present invention.

FIG. 4 is a flowchart illustrating a method for modifying a coefficient of friction of a surface of a polymeric substrate according to an embodiment of the present invention.

In step 410, a plasma stream is provided with a plasma source. The plasma stream includes a plurality of species. The species include ions and photons. In one embodiment, the plasma stream also includes uncharged (neutral) particles. In one aspect, the source may have multiple activation centers for creating different species. In other words, the source may create the different species via different mechanisms, but the total plasma stream is sent together from the source. In one embodiment, the plasma stream is inductively coupled or capacitively coupled.

In step 420, the plasma stream is modified with a shield arrangement. In one aspect, the shield arrangement includes a top shield spaced apart from the polymeric substrate. Exemplary materials for the top shield include materials listed in FIG. 2, and mentioned herein. The list of shield materials given in FIG. 2 is only a partial list, and other materials may be used.

In one embodiment, a movement of the shield is automated. With the use of different shields (potentially at different times), embodiments can provide a gradient of, for example, the amount of crosslinking and/or the coefficient of friction. In one aspect, the different shields may be slid in and out to select particular wavelengths and species. In another aspect, the shields may be rotated in and out, for example, via a robotic arm or rotisserie mechanism. Such movement may be done in an automated manner when different samples are to be treated differently, or to create graded profiles of different crosslink densities.

In one embodiment, the gradient is normal to the surface. In this manner, a large, abrupt interface between no or little crosslinking of the bulk and the high crosslinking of the surface is avoided. In one aspect, the interface between the bulk and the surface shows a continuous increase in the extent of crosslinking (e.g. the crosslinking density)

In step 430, the polymer surface is exposed to the modified plasma stream. The exposure may be from particles that pass through the shield arrangement (e.g., through the top shield) or from neutral particles that enter from the space between the top shield and the polymeric substrate. In one aspect, the shield arrangement reduces (or even eliminates) an exposure of the polymer surface to the ions in the plasma stream.

As the shield arrangement may be chosen to provide specific species of energetic particles to the plasma surface, as well as the energies of at least some of those species (e.g. photons), the polymer surface can efficiently be made to have the desired mechanical properties.

III. Determining Amount of Crosslinking

The amount of crosslinking can be important for determining the mechanical and chemical behavior of a surface of a polymeric substrate. Embodiments measure a mechanical property (such as friction (shear) force or coefficient of friction), and then correlate that measurement to an amount of crosslinking.

A description of Scanning Force Microscopy is first presented, followed by a description of the general method and results for specific embodiments of the present invention.

A. Scanning Force Microscopy

In one embodiment, the modification of the nanomechanical properties of the plasma-treated LDPE surfaces was studied and measured with a scanning force microscope consisting of an AFM (Nanoscope II, Digital Instruments, Santa Barbara, Calif.) and two capacitive force transducers—one for normal force measurement and another for tangential force measurement (Triboscope, Hysitron, Inc., Minneapolis, Minn.). In one embodiment, only one capacitive force transducer for the tangential force measurement is used.

Figure 5:
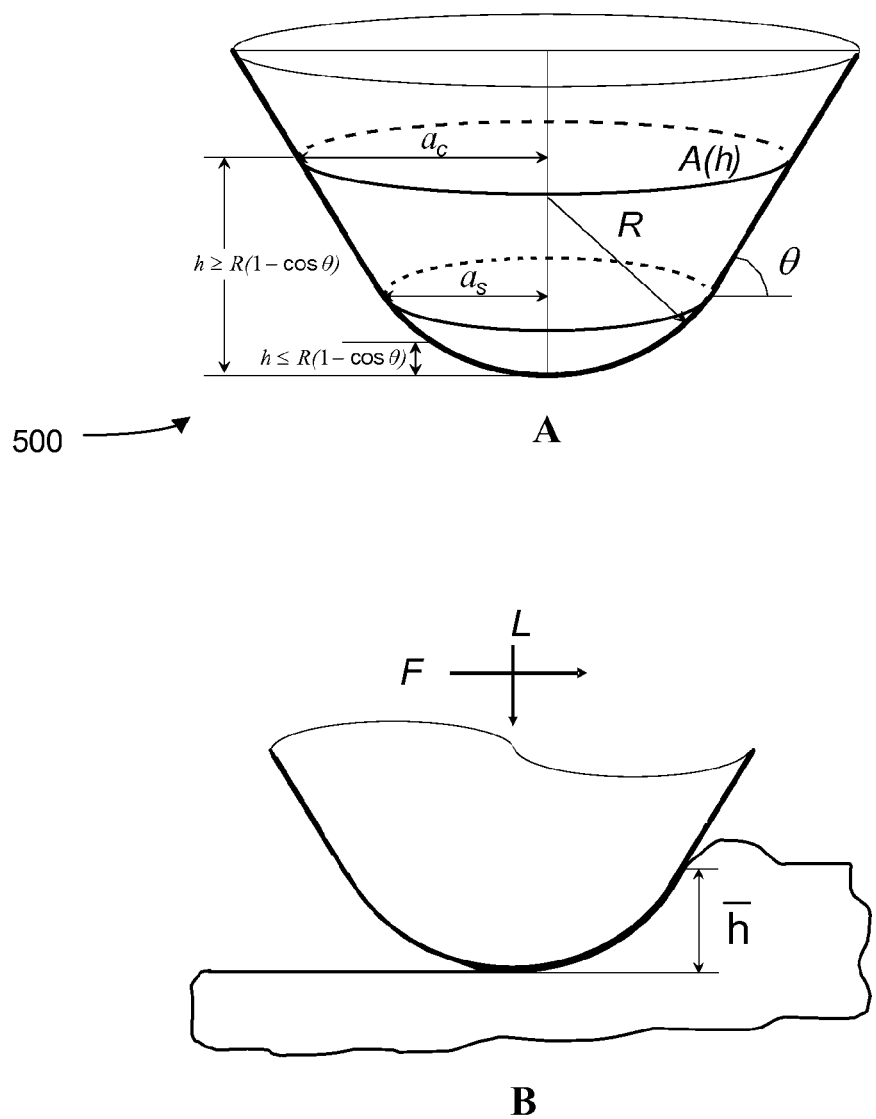
FIG. 5 shows (A) tip geometry and pertinent nomenclature and (B) schematic of nanoscratching showing the average scratch depth $\bar{h}$ according to an embodiment of the present invention.

FIG. 5 shows (A) tip geometry and pertinent nomenclature and (B) schematic of nanoscratching process showing the average scratch depth $\bar{h}$ according to an embodiment of the present invention.

To determine the effect of plasma treatment on the mechanical and tribological properties, conospherical diamond tips 500 of nominal radius of curvature R=1 and 20 μm and inclined angle θ=45° were used to scratch the polymer surfaces. The contact radius and the penetration depth h due to normal loading were determined from the relationships $$a_s = R\sin\left[\cos^{-1}\left(1 - \frac{h}{R}\right)\right] \quad (1)$$

$$a_c = (\sqrt{2} - 1)R + h \quad (2)$$

where $a_s$ and $a_c$ are contact radii corresponding to spherical and conospherical tip shapes. Depending on the penetration depth, the cross-sectional area A(h) (also referred to as the tip-shape function) was calculated from the contact radius given by Eq. (1) or Eq. (2). Before each test, the tip was cleaned with isopropanol to remove any contaminants and/or polymer debris from the previous experiment. Nanomechanical testing was performed within 3 h from plasma treatment to avoid any aging effects on the measurements.

B. Nanoscratching Method

Figure 6:
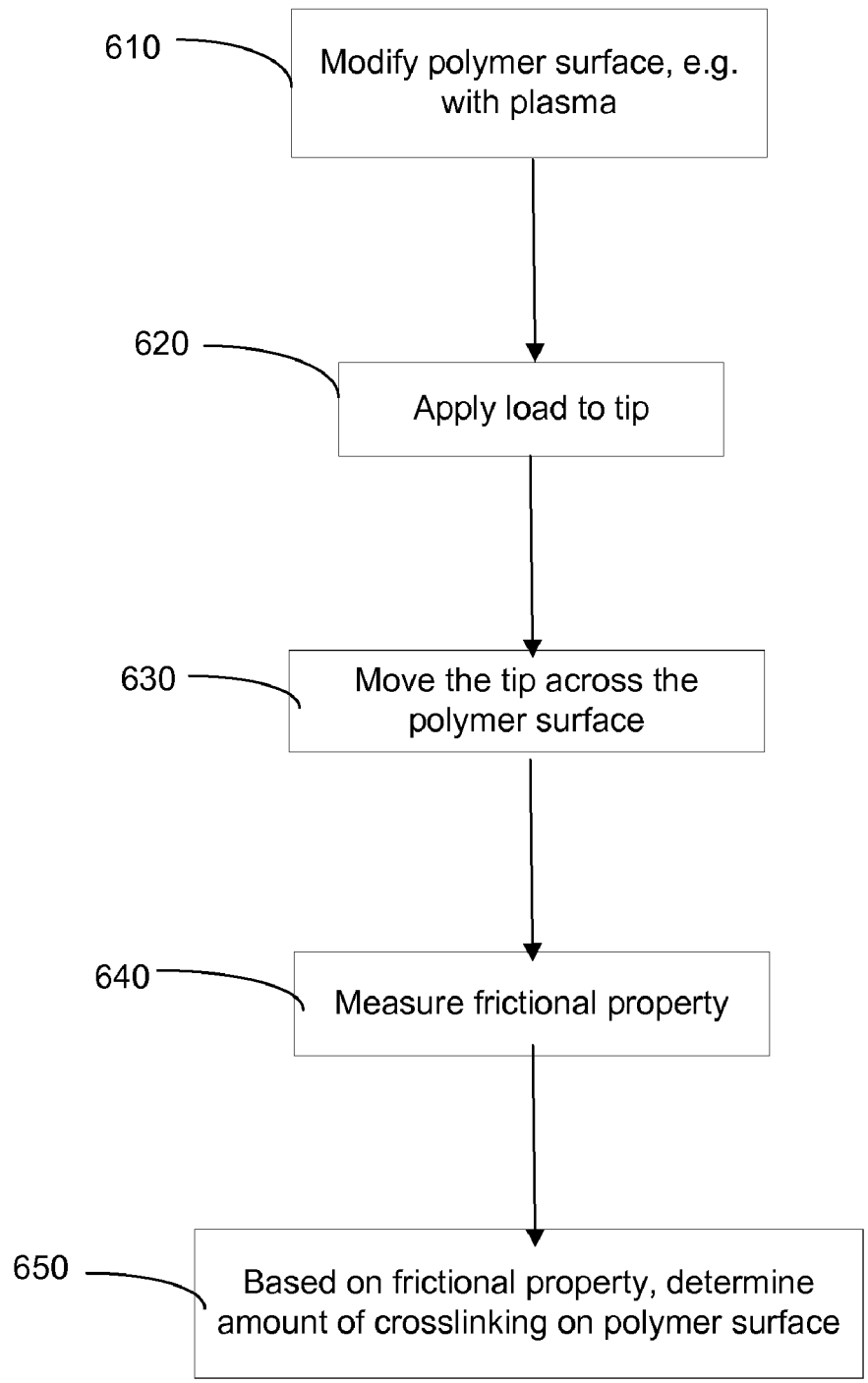
FIG. 6 is a flowchart illustrating a method for evaluating an extent of crosslinking on a polymer surface according to an embodiment of the present invention.

FIG. 6 is a flowchart illustrating a method for evaluating an extent (e.g. a level) of crosslinking in a polymer surface according to an embodiment of the present invention.

In step 610, the polymer surface is modified, e.g., with a plasma. Note that the determination of the extent of crosslinking may also be made for an unmodified surface. In one embodiment, the polymer surface modification was accomplished with a high-density plasma produced from an inductively coupled, radio frequency (rf) power source (Litmas Inc., Charlotte, N.C.). However, other plasma sources and other non-plasma sources may be used.

In one exemplary embodiment for which results are presented below, to obtain a continuous gas flow rate of 100 sccm, high purity (99.999%) Ar gas (Praxair, Danbury, Conn.) was introduced in the chamber 5 min prior to each plasma treatment. The base pressure in the main chamber was set at ~$10^{-6}$ Torr. The working pressure was maintained at 500 mTorr by a capacitance manometer and a pendulum valve. The plasma power and the treatment time were fixed at 1200 W and 15 min, respectively, and the sample distance from the plasma source (hereafter referred to as the sample distance) was varied between 0 and 58 cm to obtain different plasma intensities, e.g., ion energy fluence W in the range of (6.3-0.3)×$10^5$ J/m². The Ar flow rate of 100 sccm was maintained for 5 min after each treatment to allow active plasma species to gradually reach equilibrium. Examination of the treated samples confirmed that surface melting did not occur during plasma treatment.

In step 620, a tip (such as tip 500) is engaged with the polymer surface, and a load is applied to the tip. In one embodiment, the tip is engaged with the polymer surface under a light load (typically, ~0.5 μN), and a load is applied to the tip in a quasistatic manner (i.e., in small increments). In one aspect, the final or maximum load is in the range of about 25-1000 μN with a loading rate of about 40-60 μN/s. In another embodiment, the tip is a diamond tip; however, other tips may be used.

In step 630, the loaded tip is moved (i.e. traversed) across the polymer surface. In one aspect, as the tip is moved across the surface, the tip moves up and down as well as tangentially. In one embodiment, the sliding speed is in the range of about 0.25 to 0.3 μm/s. In one embodiment, after traversing the tip over the sample surface by a distance of 16 μm, the tip was unloaded at the same rate as for the loading In step 640, a frictional property of the surface is measured. In one embodiment, the friction force is measured and the coefficient of friction is calculated by dividing the instantaneous friction force by the applied normal load. In one aspect, changes in the load on the tip are measured by a two-parallel plate transducer.

In step 650, an extent of crosslinking in polymer surface is correlated to a frictional property. In one embodiment, the frictional property is a coefficient of friction. In one aspect, the coefficient of friction μ was obtained as the ratio of the tangential (friction) force F (measured by a two-parallel plate transducer) and the maximum normal load $L_{max}$ applied to the sample during sliding ($\mu = F/L_{max}$).

In one embodiment, the extent of crosslinking is a relative value, level, or category compared with other surfaces. For example, measurements of the frictional property of a reference surface may be used. A quantitative or absolute value of the extent of the crosslinking of the reference surface may be known or measured. The extent of crosslinking of the present surface may then be assigned to the present surface based on a comparison of the values for the frictional property of the present surface relative to the reference surface. For example, the relative level may be +10 to +1, "very high" to "just above", or other categories for frictional properties of a surface that are higher than the reference surface. Similar levels may be used for frictional properties of a surface that are lower than the reference surface. In other embodiments, the extent of crosslinking is a quantitative value.

In one embodiment, the extent of crosslinking in the plasma-treated polymer surface is determined from calibration measurements. Specifically, polymer samples with uniform through-thickness crosslink density measured by a standard method (e.g., swelling technique) can be used to measure the friction force needed to drag a certain tip under a given load along the polymer surface. Hence, a correlation between the friction force and the amount of crosslinking (e.g., crosslink density) can be obtained by varying the through-thickness crosslink density (e.g., through the adjustment of the radiation dose) and measuring the resulting friction force for a given tip and applied normal load.

In one embodiment, the measured values for the frictional property for the surfaces and the corresponding amount of crosslinking (e.g., crosslink density) for a respective surface are plotted. A functional fit or interpolation to these points may then be determined. The functional fit may use any appropriate function that has a similar behavior to the points. The interpolation may use any appropriate functions, e.g., polynomials.

C. Results and Discussion

To investigate the role of reactive plasma species on surface modification, a LiF crystal of 25 mm diameter, 2 mm thickness, and 104.6 nm cutoff wavelength (20% transmittance) was placed on top of an ethylene-propylene O-ring at a distance of 2 mm above the sample to prevent polymer interaction with $Ar^+$ ions and uncharged particles. Thus, surface modification in these treatments resulted only from VUV (wavelengths>104 nm) and UV radiation.

To evaluate the frictional characteristics of the untreated and the plasma-treated LDPE surfaces, nanoscratching experiments were carried out under conditions of normal load in the range of 50-750 µN, loading rate of 50 µN/s, and sliding speed of 0.27 µms.

To examine the effect of plasma-induced modification (i.e., crosslinking) on the friction behavior, the steady-state coefficient of friction was plotted as a function of the average scratch depth $\bar{h}$, which was shown in FIG. 5B. Six nanoscratching experiments were performed with two or three samples of the same untreated or plasma-treated LDPE. Average and standard deviation values of the friction force and the coefficient of friction were calculated from data obtained in the distance range of 6-16 µm where the friction response reached a steady-state in all the nanoscratching experiments.

C1. Friction Measurements

Figure 7:
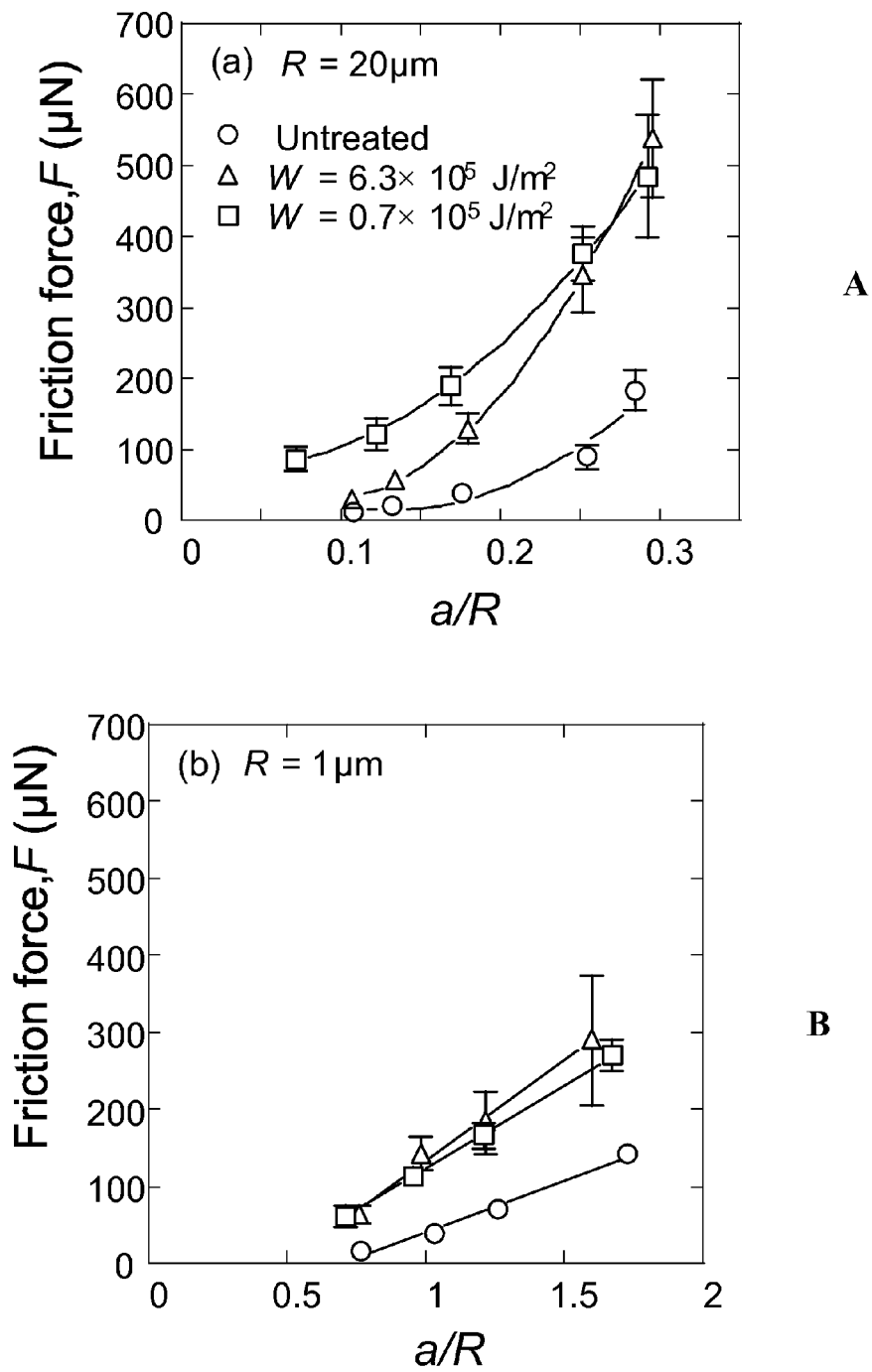
FIG. 7 shows plots of a friction force F versus normalized contact radius a/R of untreated and plasma-treated LDPE for relatively intense ($W=6.3\times10^5$ $J/m^2$) and mild ($W=0.7\times10^5$ $J/m^2$) plasma conditions and tip radius (A) R=20 μm and (B) R=1 μm according to an embodiment of the present invention.

FIG. 7 shows plots of a friction force F versus normalized contact radius a/R of untreated and plasma-treated LDPE for relatively intense (W=6.3×10$^5$ J/m$^2$) and mild (W=0.7×10$^5$ J/m$^2$) plasma conditions and tip radius (A) R=20 µm and (B) R=1 µm. The friction force is shown as a function of contact radius normalized by the tip radius for steady-state nanoscratching with the blunt (A) and the sharp (B) tip.

The friction force for plasma conditions that yielded ion energy fluence W in the range of (0.3–1.8)×10$^5$ J/m$^2$ demonstrated insignificant differences. Thus, only the friction force for W=0.7×10$^5$ J/m$^2$ is shown in FIGS. 7A and 7B for clarity. The reason for plotting the friction force as a function of a/R is that both adhesion and plowing friction components are functions of a/R. For shallow scratches (a/R<<1), the friction force is mainly due to adhesion, while for relatively deep scratches (a/R>0.2) the friction force is controlled by plowing (Komvopoulos, K., Tribol. Trans., 34:281 (1991)).

Significant differences in the friction force (i.e., surface shear resistance) of untreated and plasma-treated LDPE were observed by nanoscratching. In all cases, the friction force increased monotonically with a/R due to the increase of the volume of plowed material. However, higher friction forces exhibiting stronger dependence on a/R were obtained for plasma-treated LDPE. This is attributed to the enhancement of the surface shear strength by crosslinking of polymer chains.

FIG. 7A shows that the friction force for W=0.7×10$^5$ J/m$^2$ is significantly higher than that of the untreated polymer, while the friction force for W=6.3×10$^5$ J/m$^2$ increases from values close to those of the untreated polymer (a/R<0.15) to values similar to those of the plasma-treated LDPE for W=0.7×10$^5$ J/m$^2$ (a/R>0.25). The effect of the unmodified bulk on the measurements can be ruled out in light of the significant differences in the friction forces of the crosslinked and untreated LDPE surfaces. If such an effect were to be significant, the friction force of the crosslinked LDPE would have shown a trend to approach the friction force of the untreated material with increasing scratch depth (i.e., high values of a/R); however, an opposite trend is shown in FIG. 7A.

A significant decrease in the contact angle of LDPE has been reported for $Ar^+$ ion energy fluence in the range of (0.3–1.8)×10$^5$ J/m$^2$ (Tajima, S, and Komvopoulos, K., J. Phys. D: Appl. Phys., 39:1084 (2006)), suggesting an increase in adhesion under these plasma conditions. Thus, the much higher friction force for W=0.7×10$^5$ J/m$^2$ and a/R<0.15 seen in FIG. 7A is attributed to the increased contribution of adhesion to the total friction force.

The variation of the friction force curve for W=6.3×10$^5$ J/m$^2$ can be explained by considering the roughness effect on the real contact area. Significant surface roughening occurred for zero sample distance (W=6.3×10$^5$ J/m$^2$) due to the high intensity of $Ar^+$ ion bombardment (Tajima, S. and Komvopoulos, K., J. Phys. D: Appl. Phys., 39:1084 (2006)). Light contact loads and surface roughening resulted in the decrease of the real contact area, thus producing a lower friction force. For relatively high loads (a/R>0.25), the roughness effect on the friction force was secondary because plowing was the dominant mechanism. The high contact loads increased the real contact area and promoted plowing of the crosslinked layer.

Both of these effects contributed to the increase of the friction force. Despite the change in ion energy fluence by an order of magnitude, similar friction forces were obtained for relatively deep nanoscratches (a/R>0.25). Nanoscratching experiments performed with samples exposed to lower ion energy fluence (0.3×10$^5$ J/m$^2$) demonstrated moderately lower (~20%) friction forces, indicating a secondary effect of $Ar^+$ ion bombardment on mechanical surface modification.

FIG. 7B shows that nanoscratching with the sharp tip produced a linear variation of the friction force with the contact radius. In these experiments, the values of a/R were about an order of magnitude higher than those obtained with the blunt tip [FIG. 7A]. The trends of the friction force shown in FIGS. 7A and 7B suggest that adhesion and plowing were the dominant deformation mechanisms in the nanoscratching experiments with the blunt tip (Komvopoulos, K., Tribol. Trans., 34:281 (1991)), while microcutting was the main deformation mode for the sharp tip (Komvopoulos, K. et al., J. Tribol., 108:301 (1986)). Under microcutting conditions, the samples exposed to different ion energy fluence produced similar friction forces, approximately 2-3 times higher than those of the untreated samples, demonstrating an increase in the surface shear resistance as a result of crosslinking induced by plasma treatment.

Figure 8:
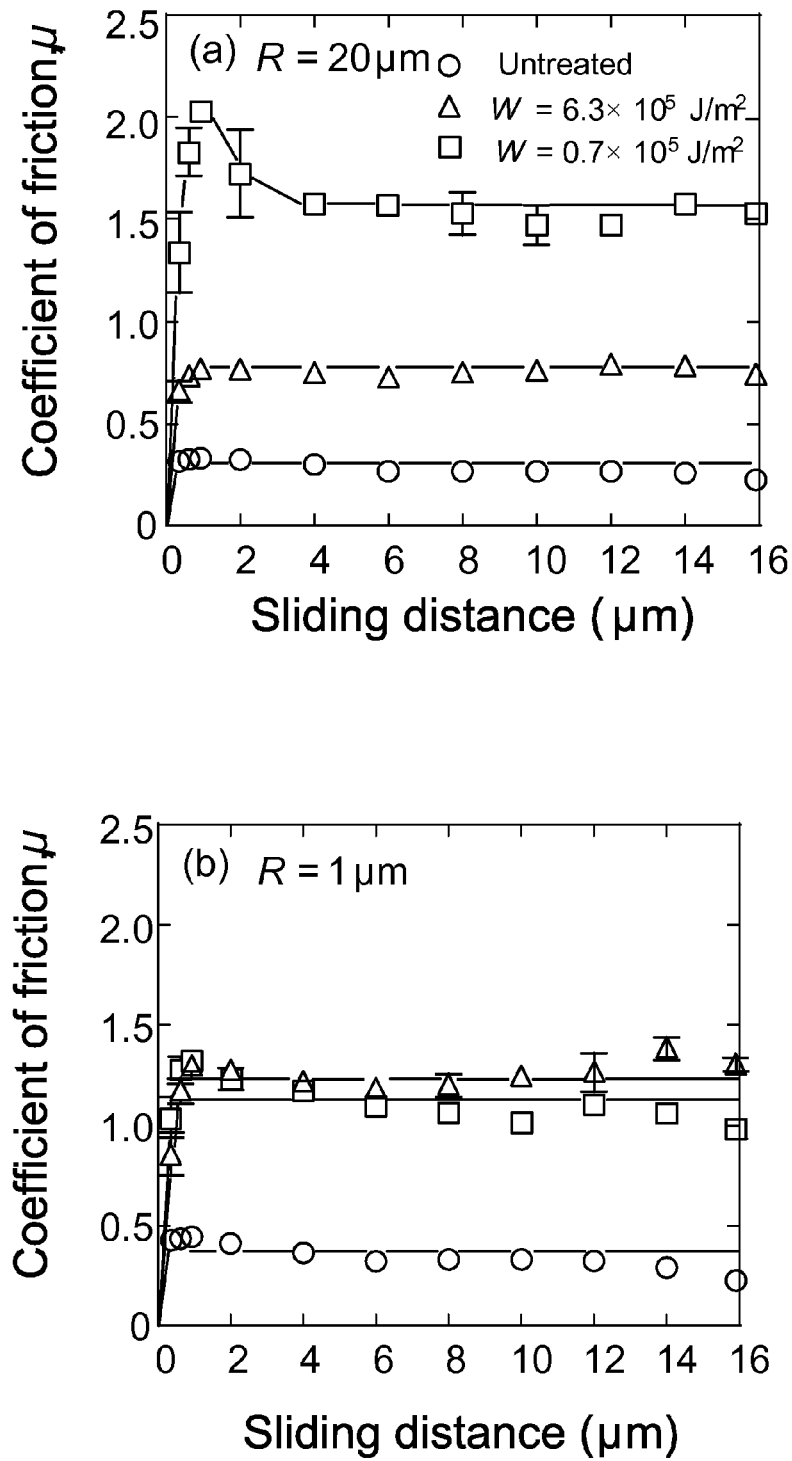
FIG. 8 shows plots of a coefficient of friction μ versus sliding distance of untreated and plasma-treated LDPE for relatively intense ($W=6.3\times10^5$ $J/m^2$) and mild ($W=0.7\times10^5$ $J/m^2$) plasma conditions and tip radius (A) R=20 μm and (B) R=1 μm according to an embodiment of the present invention.

FIG. 8 shows plots of a coefficient of friction µ versus sliding distance of untreated and plasma-treated LDPE for relatively intense (W=6.3×10$^5$ J/m$^2$) and mild (W=0.7×10$^5$ J/m$^2$) plasma conditions and tip radius (A) R=20 µm and (B) R=1 µm according to an embodiment of the present invention. The load was L=100 µN.

The common features in these plots are the occurrence of steady-state friction after sliding for a distance of ~4 µm and the significant increase of the coefficient of friction as a consequence of plasma treatment. Under sliding conditions conducive to the dominance of adhesion and plowing (blunt tip) [FIG. 8A], polymer exposure to relatively mild (W=0.7×10$^5$ J/m$^2$) and intense (W=6.3×10$^5$ J/m$^2$) plasma conditions produced friction coefficients approximately six and two times higher than that of the untreated LDPE.

Despite the significant increase in both ion energy fluence and VUV/UV radiation with decreasing sample distance, the LDPE samples treated close to the plasma source (W=6.3×

$10^5$ J/m$^2$) exhibited much lower coefficient of friction than the samples treated at a distance of 45 cm from the plasma source (W=0.7×10$^5$ J/m$^2$). This difference in the friction characteristics can be explained by considering the modification of the surface morphology under these plasma conditions.

The exposure of spherulitic structures due to etching of the amorphous phase of LDPE exposed to intense Ar plasma conditions (zero sample distance) leads to microscale roughening (Tajima, S, and Komvopoulos, K., J. Phys. D: Appl. Phys., 39:1084 (2006)). Thus, the lower coefficient of friction for W=6.3×10$^5$ J/m$^2$ in FIG. 8A is attributed to the exposure of the spherulitic structures that reduced the real contact area and, hence, the effect of adhesion.

These trends were not observed in the nanoscratching experiments with the sharp tip [FIG. 8B] because the friction force for such deep nanoscratches (see, e.g., FIG. 7) was mainly affected by the shear resistance of the subsurface due to the dominance of plowing and secondarily by the surface roughness. Thus, the higher coefficient of friction of plasma-treated LDPE [FIG. 8B] can be attributed to the increase of the surface shear strength due to chain crosslinking.

Figure 9:
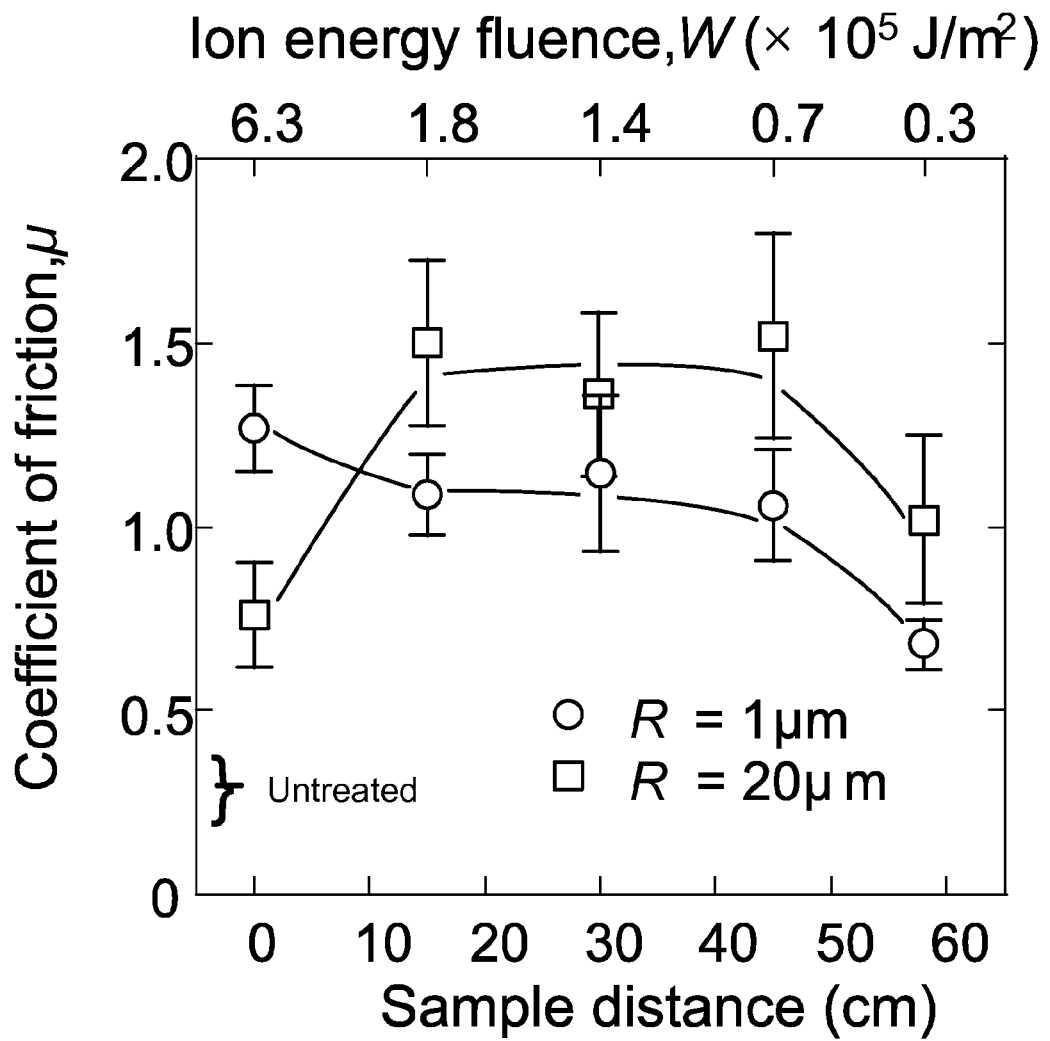
FIG. 9 shows a plot of a coefficient of friction μ versus sample distance from the plasma source and ion energy fluence for tip radius (□)R=20 μm and (○)R=1 μm according to an embodiment of the present invention.

FIG. 9 shows a plot of the steady-state coefficient of friction μ versus sample distance from the plasma source and ion energy fluence for load L=100 μN and tip radius (□)R=20 μm and (○)R=1 μm according to an embodiment of the present invention. The friction coefficient range of the untreated LDPE is also shown for comparison.

With the exception of the results for the most intense plasma conditions (W=6.3×10$^5$ J/m$^2$), which were interpreted previously (see discussion for FIG. 8), generally higher friction coefficients were obtained with the blunt tip due to the larger contact area that increased the contribution of the adhesion force to the total friction force. For a given tip size, downstream plasma treatment yielded similar coefficients of friction, except for a sample distance equal to 58 cm (W=0.3×10$^5$ J/m$^2$). This trend reveals the existence of a critical sample distance (~45 cm) corresponding to thresholds of ion energy fluence (~0.7×10$^5$ J/m$^2$) and VUV/UV radiation intensity for crosslink site saturation. Hence, the decrease of the coefficient of friction for W=0.3×10$^5$ J/m$^2$ is attributed to the lower shear strength of the partially crosslinked polymer surface.

To further evaluate the effect of the plasma conditions on the extent of mechanical modification, the normal load was varied to indirectly determine the degree of crosslinking as a function of depth.

Figure 10:
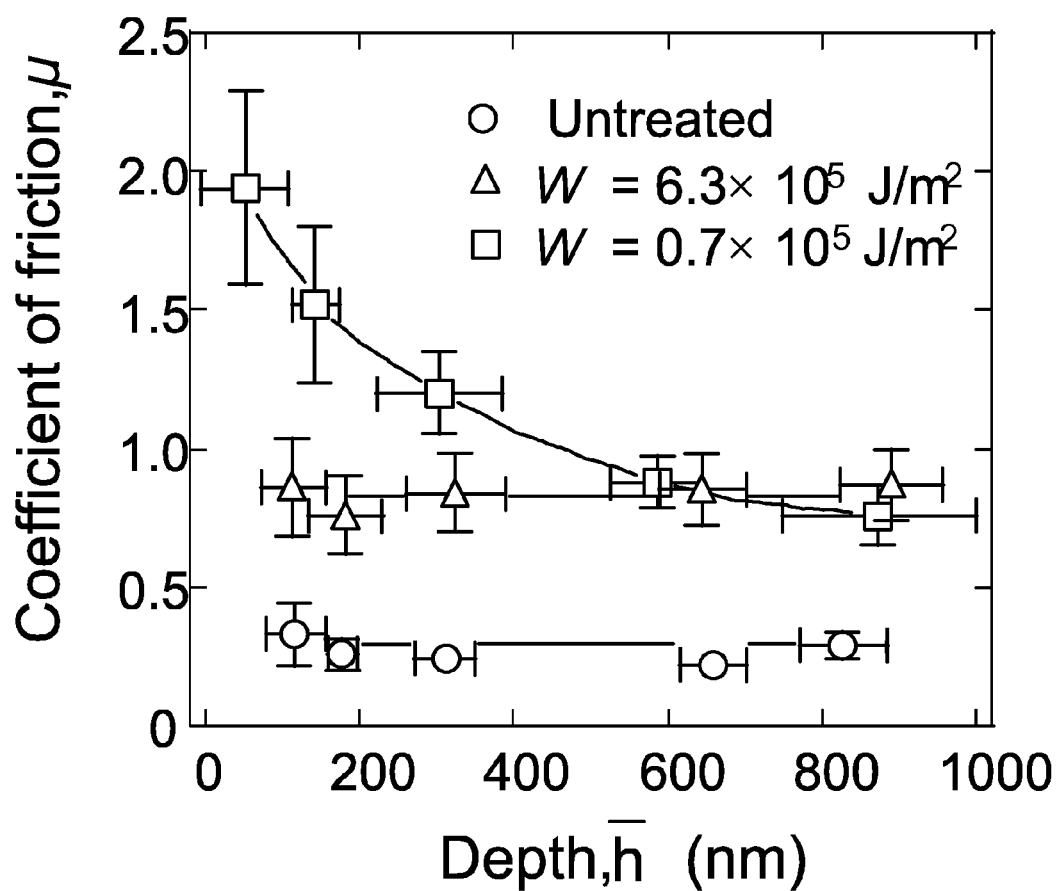
FIG. 10 shows a plot of a coefficient of friction μ versus average scratch depth $\bar{h}$ of untreated (○) and plasma-treated LDPE for relatively intense (Δ) ($W=6.3\times10^5$ $J/m^2$) and mild (□) ($W=0.7\times10^5$ $J/m^2$) plasma conditions and tip radius R=20 μm according to an embodiment of the present invention.

FIG. 10 shows a plot of a coefficient of friction μ versus average scratch depth $\bar{h}$ of untreated (○) and plasma-treated LDPE for relatively intense (Δ) (W=6.3×10$^5$ J/m$^2$) and mild (□) (W=0.7×10$^5$ J/m$^2$) plasma conditions and tip radius R=20 μm according to an embodiment of the present invention. The higher coefficients of friction of plasma-treated LDPE indicate a significant enhancement of the surface shear strength. This is evidence for plasma-induced modification of the surface mechanical behavior by crosslinking.

The friction coefficients of the untreated and the intensively plasma-treated (W=6.3×10$^5$ J/m$^2$) LDPE do not exhibit scratch depth dependence. This is in contrast to the decrease of the coefficient of friction of the LDPE exposed to relatively mild plasma conditions (W=0.7×10$^5$ J/m$^2$) from values on the order of ~2.0 at the surface to values of ~1.0 at a depth of ~600 nm, which is close to the coefficient of friction of LDPE exposed to the most intense plasma conditions.

A comparison of the results for W=0.7×10$^5$ J/m$^2$ and 6.3× 10$^5$ J/m$^2$ indicates that intense plasma treatment resulted in lower friction, implying less crosslinking. This result is attributed to the bombardment of highly energetic Ar$^+$ ions that roughened the polymer surface by etching the crosslinked domains. However, the relatively mild plasma conditions obtained for a sample distance of 45 cm (W=0.7×10$^5$ J/m$^2$) yielded less energetic Ar$^+$ ions that did not damage the crosslinked layer.

C2. Surface Molecular Models

Figure 11:
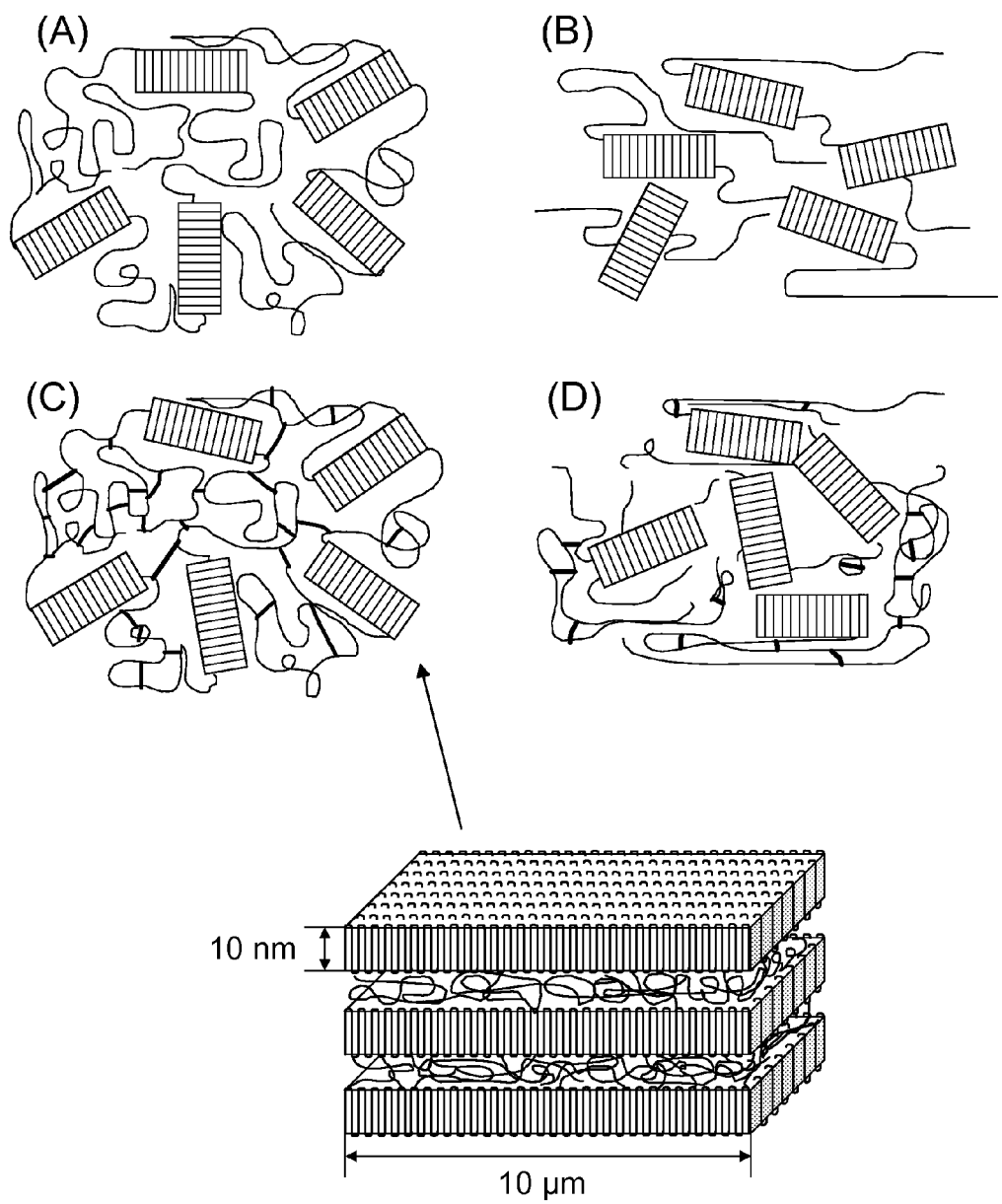
FIG. 11 shows surface molecular models of (A) untreated LDPE before scratching, (B) untreated LDPE after scratching, (C) crosslinked LDPE before and after scratching with a blunt tip, and (D) crosslinked LDPE after scratching with a sharp tip according to an embodiment of the present invention. The inset at the bottom of the figure shows a close view of crystalline lamellae. Chain crosslinking in (C) and (D) is denoted by thick solid lines bridging molecular chains in the amorphous phase.

The presented results can be interpreted in the context of the surface molecular models shown in FIGS. 11 and 12. FIG. 11 shows surface molecular models of (A) untreated LDPE before scratching, (B) untreated LDPE after scratching, (C) crosslinked LDPE before and after scratching with a blunt tip, and (D) crosslinked LDPE after scratching with a sharp tip. The inset at the bottom of the figure shows a close view of crystalline lamellae. Chain crosslinking in (C) and (D) is denoted by thick solid lines bridging molecular chains in the amorphous phase.

In these schematics, rectangular domains represent the crystalline phase, while the surrounding molecular chains comprise the amorphous phase. The original microstructure consists of an amorphous matrix with randomly distributed crystalline domains, known as lamellae [FIG. 11A]. Shear deformation causes restructuring of the molecular chains and lamellae rearrangement adjacent to the surface along the direction of shearing due to the unrestricted movement of the molecular chains in the amorphous phase [FIG. 11B].

Thus, the surface shear resistance is controlled by the amorphous phase, which is the weaker component in the polymer microstructure. This explains the significantly lower friction force (FIG. 7) and coefficient of friction (FIGS. 8-10) of untreated LDPE compared to plasma-treated LDPE.

Plasma-induced crosslinking restricts chain mobility in the amorphous phase through the development of three-dimensional networks of crosslinked molecular chains [FIG. 11C]. Since the crosslink concentration depends on the energetic state of plasma species (e.g., Ar$^+$ ion energy fluence and VUV/UV radiation intensity), the strength of the crosslinked layer evaluated by the friction force and the coefficient of friction depends strongly on the intensity of the plasma conditions. Thus, the higher friction of the plasma-treated LDPE (FIGS. 7-10) is attributed to the increase of the surface shear strength due to the effect of chain crosslinking.

The lower coefficient of friction obtained with the sharp tip (FIG. 9) can be explained by the molecular model shown in FIG. 11D. The trends in the results shown in FIG. 7 indicate that microcutting was the dominant mechanism in the nanoscratching experiments with the sharp tip, whereas adhesion and plowing prevailed in the experiments with the blunt tip. The high shear strains generated by the sharper tip promoted chain breakage in the amorphous phase, which compromised the effectiveness of chain crosslinking to inhibit molecular movement. As a consequence, the surface shear decreased, resulting in lower coefficient of friction in the nanoscratching experiments with the sharp tip (FIG. 9). Thus, in one aspect, a tip of radius R=20 μm or greater is preferable.

FIG. 12 shows surface molecular models of LDPE exposed to relatively (A) intense (W=6.3×10$^5$ J/m$^2$) and (B) mild (W=0.7×10$^5$ J/m$^2$) plasma conditions according to an embodiment of the present invention. The coefficient of friction of the LDPE subjected to intense plasma treatment (FIGS. 8-10) can be interpreted in the light of the surface molecular models shown in FIG. 12. The preferential etching of the weaker amorphous phase under these plasma conditions produced a surface topography dominated by spherulitic structures of crystalline lamellae. Plasma etching of the crosslinked amorphous phase degraded the shear strength and increased the roughness of the polymer surface [FIG. 12A].

The decrease of both the real contact area due to surface roughening and the surface shear resistance due to etching of the crosslinked interlamellar regions are the main reasons for the lower coefficient of friction obtained for zero sample distance. Because the plasma conditions for sample distance≧15 cm were not conducive to etching, the integrity of the crosslinked layer was maintained. Consequently, the variation of the coefficient of friction of the downstream treated samples shown in FIG. 9 can be attributed to the decrease of the crosslink density with increasing depth [FIG. 12B].

C3. Effect of Plasma Species on Surface Modification

Figure 13:
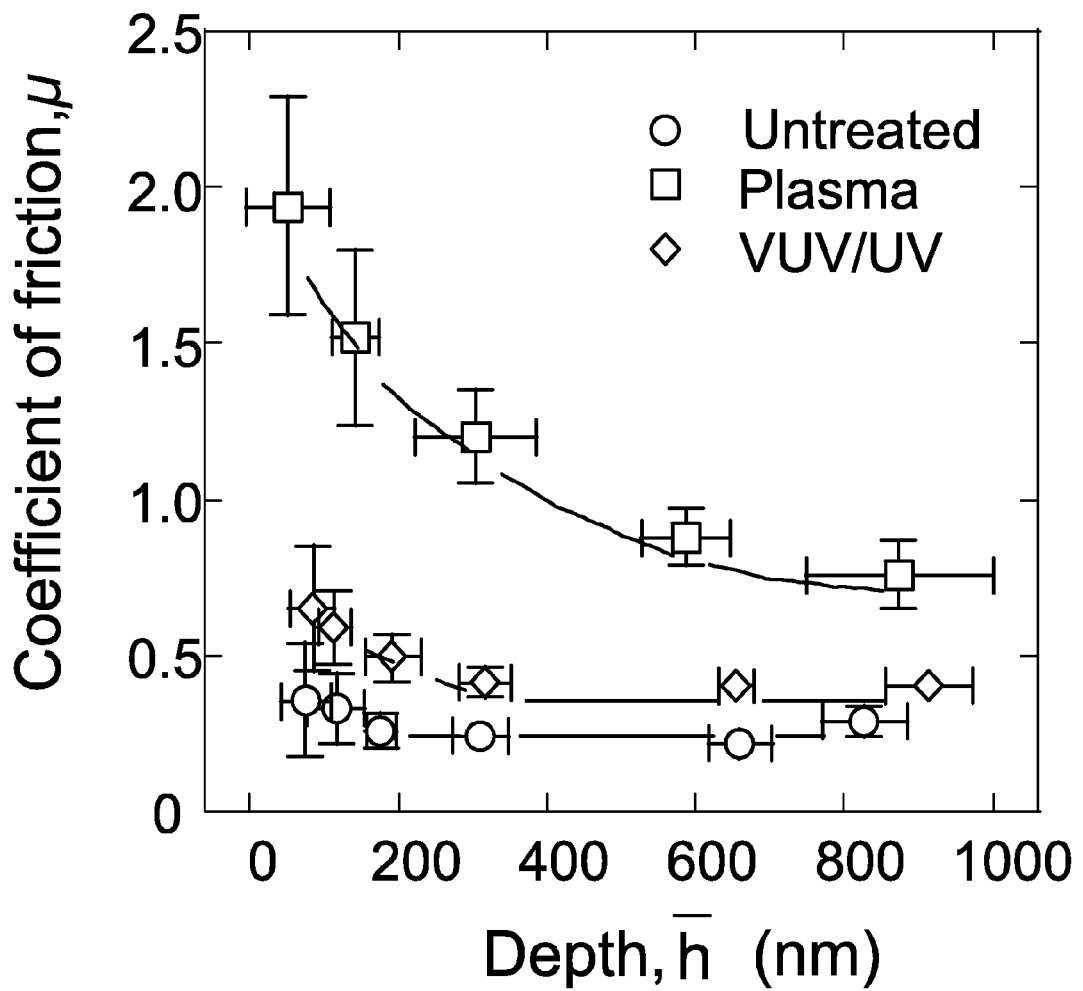
FIG. 13 shows a plot of a coefficient of friction μ versus average scratch depth $\bar{h}$ of (○) untreated, (□) plasma-treated, and (◇) VUV/UV-treated LDPE for tip radius R=20 μm. Both types of treatment were performed under relatively mild plasma conditions ($W=0.7\times10^5$ $J/m^2$) according to an embodiment of the present invention.

The role of radiation in surface crosslinking is elucidated from nanoscratching experiments performed with LDPE samples exposed only to VUV and UV radiation. FIG. 13 shows a coefficient of friction $\mu$ versus average scratch depth $\bar{h}$ of (○) untreated, (□) plasma-treated, and (◇) VUV/UV-treated LDPE for tip radius R=20 µm. Both types of treatment were performed under relatively mild plasma conditions (W=0.7×10$^5$ J/m$^2$) according to an embodiment of the present invention. A comparison of the coefficients of friction of untreated, plasma-treated, and VUV/UV-treated LDPE obtained at various scratch depths for sample distance fixed at 45 cm (W=0.7×10$^5$ J/m$^2$) is shown.

The much lower coefficient of friction of the shielded LDPE indicates that VUV/UV-induced crosslinking differs significantly from crosslinking resulting from the superimposed effects of all plasma species. The slightly higher coefficient of friction of VUV/UV-treated LDPE than that of the untreated LDPE indicates that VUV/UV radiation produced some degree of mechanical modification. However, the remarkably higher coefficient of friction of the plasma-treated LDPE suggests that crosslinking is mainly due to the superimposed effects of ions, uncharged particles, and VUV/UV photons, while radiation alone is significantly less effective in inducing crosslinking.

The presented results provide insight into the plasma conditions leading to specific modification of polymer surface properties. For example, from the adhesion strength perspective, the effect of plasma parameters (e.g., ion energy fluence and radiation intensity, which depend on the power and sample distance) on surface roughness, wetability, and surface chemistry must be considered in conjunction with the resulting mechanical modification. Although the plasma conditions for downstream treatment yielded small changes in micro-/nanoscale roughness and type of surface functionalities, the most hydrophilic surfaces were obtained under plasma conditions corresponding to a sample distance of 15 cm.

In addition to the dependence of the previous properties on the plasma conditions, the obtained results suggest that the effects of ions, uncharged particles, and VUV/UV photons on surface crosslinking should also be considered in evaluating the changes in the surface nanomechanical properties. For instance, the Ar$^+$ ion energy fluence must be controlled to prevent etching of the crosslinked layer. The nanoscratching experiments indicate that the highest degree of crosslinking was obtained under the plasma conditions produced for a sample distance of 15 cm. This suggests that plasma-induced surface modification can be tailored to improve specific surface properties by placing the sample to a distance from the plasma source that yields the desired plasma treatment conditions.

In summary, surface force microscope experiments revealed a strong dependence of nanomechanical surface modification on plasma conditions which vary with the sample distance from the plasma source. Significant differences in the nanomechanical properties of untreated and plasma-treated LDPE were observed by nanoscratching. The friction force and the coefficient of friction of the plasma-treated LDPE were much higher than those of the untreated polymer. The dominant friction mechanisms were adhesion, plowing, and microcutting, depending on the tip size and the average scratch depth (or ratio of contact radius to tip radius). Similar friction coefficients were obtained under plasma conditions corresponding to sample distance in the range of 15-45 cm due to saturation of the crosslink sites. The LDPE samples treated close to the plasma source exhibited much lower coefficients of friction due to etching of the crosslinked layer by highly energetic Ar$^+$ ions. The lower scratch resistance of VUV/UV-treated LDPE than that of plasma-treated LDPE indicated that radiation-induced crosslinking differs significantly from crosslinking due to simultaneous interactions of ions, uncharged particles, and photons with the polymer surface. Thus, different extents of surface modification (crosslinking) can be obtained by varying the sample distance from the plasma source.

The following are examples of plasma systems and apparatus for performing embodiment of the present invention.

Figure 14:
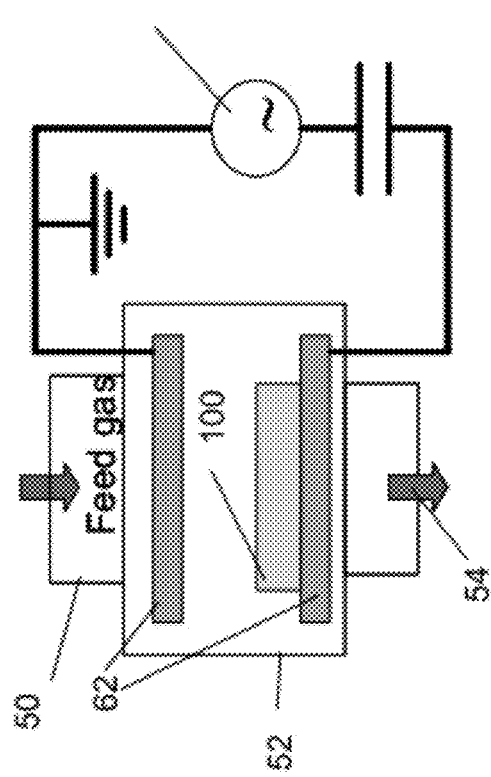
FIG. 14 shows a schematic illustration of a capacitively coupled plasma apparatus according to an embodiment of the present invention.

FIG. 14 shows a schematic illustration of a capacitively coupled plasma apparatus according to an embodiment of the present invention. In a capacitively coupled plasma (CCP) process, electrodes are placed inside a plasma processing chamber, and they ionize precursor gases to form a plasma. FIG. 14 shows a chamber 52 with an inlet port 50 and a downstream outlet port 54. Electrodes 62 are within the chamber, and are operatively coupled to an rf power source 60. A sample 100 (e.g., the previously described substrate) may rest on one of the electrodes 62. As a feed gas is introduced into the chamber 52, the gas is ionized by the electrodes 62. The ionized gas and neutral atoms or molecules may thereafter interact with the sample 100.

Figure 15:
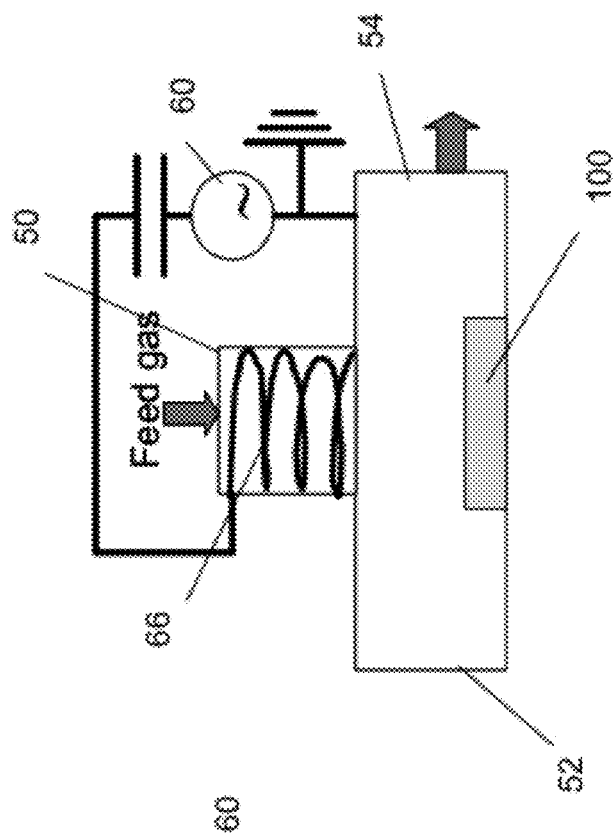
FIG. 15 shows a schematic illustration of an inductively coupled plasma apparatus according to an embodiment of the present invention.

FIG. 15 shows a schematic illustration of an inductively coupled plasma apparatus according to an embodiment of the present invention. An inductively coupled plasma (ICP) may also be used to deposit the fluorocarbon film on the polymeric substrate. Inductively coupled plasma processes are described above in the pretreatment process. Similar processing conditions can be used in the deposition of the fluorocarbon film; however, the feed gas will be different in the fluorocarbon layer formation process than in the pretreatment process. Examples of suitable feed gases are provided below.

FIG. 15 includes a chamber 52 and a sample 100 in the chamber 52. The chamber includes an inlet 50 and an outlet 54. A coil 66 is proximate to the inlet 66 and is electrically coupled to an rf power source 60. The feed gas 50 is introduced into the chamber 52 via the inlet 50, and when it is introduced, it is ionized by the coil 66 and the ionized gases pass into the chamber 52 and interact with sample 100.

Any one or more features of one or more embodiments may be combined with one or more features of any other embodiment without departing from the scope of the invention.

Any recitation of "a", "an" or "the" is intended to mean "one or more" unless specifically indicated to the contrary.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

All references, applications, and patents cited above are herein incorporated by reference in their entirety for all purposes. None is admitted to be prior art.

What is claimed is:

1. A method of modifying a coefficient of friction of a surface of a polymeric substrate, the method comprising:
   providing a plasma stream generated by a plasma source, the plasma stream including a plurality of species of particles, wherein the plurality of species includes ions and photons;
   modifying the plasma stream with a shield arrangement comprising a top shield spaced apart from the polymeric substrate, wherein the top shield is positioned between the plasma source and the polymeric substrate and at least partially covers the polymeric substrate; and
   exposing the polymer surface to the modified plasma stream, wherein the shield arrangement reduces an exposure of the polymer surface to at least the ions.

2. The method of claim 1, wherein the plurality of species includes uncharged particles, and wherein the shield arrangement includes side shields that reflect the uncharged particles.

3. The method according to claim 1, wherein the shield arrangement is coupled to a motor.

4. The method according to claim 1, wherein the top shield is fabricated from an inorganic material.

5. The method according to claim 1, wherein the inorganic material is selected from the group consisting of Al, Pyrex®, LiF, $CaF_2$, $Al_2O_3$, and $SiO_2$.

6. The method of claim 1, further comprising: modifying the polymer surface with one or more additional shield arrangements.

7. The method of claim 6, wherein only one shield arrangement modifies the plasma stream at one instant in time, and wherein each subsequent shield arrangement provides an increase or a decrease in a depth of crosslinking in the polymeric substrate.

8. The method of claim 1, wherein the top shield reflects at least 80% of photons of an energy higher than a cutoff energy threshold, and wherein the cutoff energy threshold lies within a range produced by the plasma source.

9. The method of claim 8, wherein the plurality of species includes uncharged particles, and wherein the modified plasma stream includes at least a portion of the uncharged particles.

10. The method of claim 9, wherein the uncharged particles reflect off of a sample holder on which the polymeric substrate resides before reaching the polymeric substrate.

11. The method of claim 1, wherein the plasma is an inductively coupled plasma.

12. The method of claim 1, wherein the plasma source provides photons having a wavelength within a range of at least 50 nm.

13. The method of claim 12, wherein the range is in the UV spectrum.

14. A method of evaluating an extent of crosslinking in a surface of a polymeric substrate, the method comprising:
   applying a load to a tip;
   moving the tip across the surface of the polymeric substrate;
   measuring a frictional property of the surface from a friction force imparted on the tip from the surface during movement of the tip; and
   based on the measured frictional property, determining an extent of crosslinking in the polymer surface.

15. The method of claim 14, wherein the tip has a nominal radius of curvature of 20 micrometers or larger.

16. The method of claim 14, wherein the frictional property is the coefficient of friction.

17. The method of claim 16, wherein the coefficient of friction is determined as the ratio of a tangential force on the tip measured during movement across the surface and the maximum normal load applied to the surface by the tip during the movement.

18. The method of claim 14, wherein the extent of crosslinking is a qualitative level of crosslinking relative to at least one reference surface.

19. The method of claim 18, wherein a quantitative value for an amount of crosslinking for the reference surface is used in determining the qualitative level of crosslinking.

20. The method of claim 14, wherein determining an extent of crosslinking in the polymer surface includes correlating the measured frictional property to the extent of crosslinking using calibrated values for the relationship between the frictional property and the extent of crosslinking.

21. The method of claim 20, wherein the calibrated values are determined by varying an amount of crosslinking of at least one reference surface; measuring an amount of crosslinking in the reference surface; and
   measuring the frictional property of the reference surface.

22. The method of claim 21, wherein measuring the amount of crosslinking is performed using the swelling technique.

23. The method of claim 20, wherein the calibrated values are further determined by performing a functional fit or interpolation of the points for the frictional property versus the amount of crosslinking.

24. A method of modifying a coefficient of friction of a surface of a polymeric substrate, the method comprising:
   providing a plasma stream generated by a plasma source, the plasma stream including a plurality of species of particles, wherein the plurality of species includes ions and photons;
   modifying the plasma stream with a shield arrangement, wherein the shield arrangement includes a top shield coupled to a motor and spaced apart from the polymeric substrate;
   exposing the polymer surface to the modified plasma stream, wherein the shield arrangement reduces an exposure of the polymer surface to at least the ions.

25. The method of claim 24, further comprising: modifying the polymer surface with one or more additional shield arrangements.

26. The method of claim 25, wherein only one shield arrangement modifies the plasma stream at one instant in time, and wherein each subsequent shield arrangement provides an increase or a decrease in a depth of crosslinking in the polymeric substrate.

* * * * *